(12) United States Patent
Hall et al.

(10) Patent No.: US 12,557,210 B2
(45) Date of Patent: Feb. 17, 2026

(54) ELECTRONIC APPARATUS MINIMIZING DIFFERENTIAL THERMAL CONTRACTION FOR CRYOGENIC QUANTUM COMPUTERS

(71) Applicant: International Business Machines Corporation, Armonk, NY (US)

(72) Inventors: Shawn Anthony Hall, Pleasantville, NY (US); Michael Justin Beckley, New York, NY (US); John Michael Cotte, New Fairfield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 601 days.

(21) Appl. No.: 18/053,167

(22) Filed: Nov. 7, 2022

(65) Prior Publication Data

US 2024/0155759 A1    May 9, 2024

(51) Int. Cl.
  *H05K 1/02*    (2006.01)
  *H05K 1/181*   (2026.01)
  *H05K 7/20*    (2006.01)
  *H01L 23/14*   (2006.01)

(52) U.S. Cl.
  CPC .......... *H05K 1/0271* (2013.01); *H05K 1/181* (2013.01); *H05K 7/20509* (2013.01); *H01L 23/147* (2013.01); *H05K 7/20372* (2013.01); *H05K 2201/09063* (2013.01);
  (Continued)

(58) Field of Classification Search
  CPC .. H05K 1/0271; H05K 1/181; H05K 7/20509; H05K 2201/09063; H05K 2201/09072; H05K 2201/10378; H05K 2201/10409; H05K 2201/2018; H05K 7/20372; H05K 2201/10515; H01L 24/16; H01L 23/147; H01L 2224/16225
  See application file for complete search history.

(56) References Cited

U.S. PATENT DOCUMENTS 10,256,206 B2   4/2019  Falcon et al.
10,380,496 B2   8/2019  Elsherbini et al.
10,394,292 B1*  8/2019  Van Dyke .............. H10N 60/12
(Continued)

FOREIGN PATENT DOCUMENTS

EP        3792956 A1    3/2021

OTHER PUBLICATIONS

Megtron 6 Datasheet, Panasonic; PCB Materials (Year: 2024).*
(Continued)

*Primary Examiner* — Steven T Sawyer
(74) *Attorney, Agent, or Firm* — Amin, Turocy & Watson, LLP

(57) ABSTRACT

One or more devices and/or methods provided herein relate to a method for fabricating a filtering electronic device having a co-integrated impedance modification element and signal transmission line. An electronic structure can comprise a circuit board, and a first plate and a second plate retaining the circuit board therebetween, wherein the first plate and the second plate each have a cryogenic thermal contraction rate that is lower than a cryogenic thermal contraction rate of the circuit board. In one or more embodiments, a silicon chip can be physically coupled to the circuit board by a plurality of solder bumps and disposed between the first plate and the second plate.

19 Claims, 15 Drawing Sheets

(52) U.S. Cl.
CPC .............. *H05K 2201/09072* (2013.01); *H05K 2201/10378* (2013.01); *H05K 2201/2018* (2013.01)

(56) References Cited

U.S. PATENT DOCUMENTS

| | | | |
|---|---|---|---|
| 10,468,578 B2 | 11/2019 | Elsherbini et al. | |
| 10,468,793 B2 | 11/2019 | Petroff et al. | |
| 10,769,546 B1 | 9/2020 | Rigetti et al. | |
| 10,840,078 B1 | 11/2020 | Youngner et al. | |
| 11,152,707 B1* | 10/2021 | Janett | H05K 1/0243 |
| 2004/0173901 A1* | 9/2004 | Mallik | H05K 1/0204 |
| | | | 257/E23.101 |
| 2008/0086033 A1* | 4/2008 | Mihalca | B23K 20/08 |
| | | | 600/160 |
| 2009/0294954 A1* | 12/2009 | Bakir | H01L 23/473 |
| | | | 257/713 |
| 2017/0142820 A1* | 5/2017 | Christiansen | H05K 1/0204 |
| 2020/0135608 A1* | 4/2020 | Kelley | H05K 7/20809 |
| 2021/0019646 A1 | 1/2021 | Sterling | |
| 2021/0399196 A1 | 12/2021 | Kikuchi et al. | |
| 2022/0344240 A1* | 10/2022 | Lee | H01L 21/4857 |
| 2023/0108475 A1* | 4/2023 | Snow | H01L 23/3736 |
| | | | 257/712 |

OTHER PUBLICATIONS

Thermal Expansivity and Density of Indium; Blair et al.; Research paper RP1541; National Bureau of Standards; Published Jun. 1943 (Year: 1943).*

Bryant, et al., "Low Temperature Specific Heat of Molybdenum," J. Chem. Phys. 35, 1149 (1961); https://doi.org/10.1063/1.1701213.

Duthil, "Material Properties at Low Temperature," CERN Yellow Report CERN-2014-005, pp. 77-95, Jan. 28, 2015, https://doi.org/10.5170/CERN-2014-005.77.

Nist, "Material Properties: Molybdenum," https://trc.nist.gov/cryogenics/materials/Molybdenum/Molybdenum_rev.htm, Retrieved from the Internet: Sep. 30, 2022.

Pobell, "Matter and Methods at Low Temperatures," 201 Springer-Verlag Berlin Heidelberg 1992, ISBN-10 3-540-46356-9.

* cited by examiner

ELECTRONIC APPARATUS MINIMIZING DIFFERENTIAL THERMAL CONTRACTION FOR CRYOGENIC QUANTUM COMPUTERS

FIELD OF THE INVENTION

The present disclosure relates generally to electronic structures comprising silicon chips, and more specifically to such electronic structure serving as a quantum computer payload comprising a silicon qubit chip and being constructed to be used in a low temperature range at which a qubit of a quantum computing system operates.

BACKGROUND

In quantum computing systems, semiconductors and/or other chip-based applications, electronic structures that can function as controllers and/or payloads, among other uses, can be exposed to swings in temperatures. This can result in a raised temperature or a lowered temperature, such as in a milli-Kelvin (mK) range, for operation of a superconducting qubit of a quantum computing system. Components of existing electronic structures for use at such low temperature range can be subject to failure due to material contraction and/or due to shear stresses caused by differential thermal contraction between the components. As used herein, a mK range can be below and/or equal to 10K, such as below 0.4K and above and/or equal to 0.001K.

SUMMARY

The following presents a summary to provide a basic understanding of one or more embodiments described herein. This summary is not intended to identify key or critical elements, and/or to delineate scope of embodiments or scope of claims. Its sole purpose is to present concepts in a simplified form as a prelude to the more detailed description that is presented later. In one or more embodiments described herein, systems, methods and/or apparatuses can facilitate a process to employ an electronic chip at a substrate, such as a silicon chip at a printed circuit board (PCB), with reduction of, and/or fully absent of, a differential contraction that can occur between an electronic chip and a substrate in existing electronic structures.

In accordance with one or more embodiments, an electronic structure can comprise a printed circuit board (PCB), a silicon chip electrically coupled, and such as mechanically affixed, to the PCB by a plurality of solder bumps, and a first plate and a second plate that retain the PCB and silicon chip therebetween.

In one or more embodiments, the first plate and the second plate each have a total cryogenic thermal contraction rate that is lower than a total cryogenic thermal contraction rate of the PCB. As used herein, the cryogenic thermal contraction (CTC) rate can be mathematically referred to (in units of $\mu m/mm$) as the integral of thermal coefficient of expansion (CTE [$\mu m/mm/K$]) from a cryogenic temperature T to room temperature $T_r$. As used herein a total cryogenic thermal contraction rate can refer to a thermal contraction rate value when a lower limit T of the integral is at or near 0.

In accordance with one or more embodiments, an electronic structure can comprise a circuit board, and a first plate and a second plate retaining the circuit board therebetween, wherein the first plate and the second plate each have a cryogenic thermal contraction rate that is lower than a cryogenic thermal contraction rate of the circuit board. In one or more embodiments, a silicon chip can be electrically coupled to the circuit board and disposed between the first plate and the second plate.

In one or more embodiments, a silicon chip can be physically coupled to the circuit board by a plurality of solder bumps and disposed between the first plate and the second plate.

An advantage of the aforementioned electronic structure can be an ability to allow, with minimal or prevented damage to the silicon chip or to the solder bumps, use of the electronic structure at low temperatures, such as a cryogenic temperature of a dilution refrigerator of a cryogenic unit of a quantum computer. Such damage can be minimized and/or avoided because the low-contraction-rate first plate and second plate can be affixed firmly to the PCB, can hold the PCB in tension by virtue of frictional forces, and/or can minimize and/or prevent the PCB from contracting as much as the PCB would contract absent the first plate and the second plate. Thus, a differential contraction rate between the PCB and silicon chip can be reduced, thereby reducing and/or avoiding damage to the chip and/or to the solder bumps.

Another advantage of the aforementioned electronic structure can be reduction of local slippage between plates due to forces between the plates, such as frictional forces, which can in turn can reduce and/or prevent shrinkage of the circuit board.

Still another advantage of the aforementioned electronic structure can be reduction in exacerbation of differential contraction between plates and the PCB of the electronic structure through use of materials for the first plate or the second plate having a cryogenic contraction $C_M$ that is lower than that of the PCB.

In accordance with another embodiment, a method for fabricating an electronic structure by a fabrication system can comprise coupling, by the fabrication system, a silicon chip to a circuit board, and coupling, by the fabrication system, a first plate and a second plate to the circuit board with the circuit board being retained between the first plate and the second plate, wherein the first plate and the second plate each have a cryogenic thermal contraction rate that is lower than a cryogenic thermal contraction rate of the circuit board.

In one or more embodiments, a silicon chip can be electrically coupled to the circuit board and disposed between the first plate and the second plate.

An advantage of the aforementioned method can be an ability to allow, with minimal or prevented damage to the silicon chip or to the solder bumps, use of the electronic structure at low temperatures, such as a cryogenic temperature of a dilution refrigerator of a cryogenic unit of a quantum computer. Such damage can be minimized and/or avoided because the low-contraction-rate first plate and second plates can be affixed firmly to the PCB, can hold the PCB in tension by virtue of frictional forces, and/or can minimize and/or prevent the PCB from contracting as much as the PCB would contract absent the first plate and the second plate. Thus, a differential contraction rate between the PCB and silicon chip can be reduced, thereby reducing and/or avoiding damage to the chip and/or to the solder bumps.

Another advantage of the aforementioned method can be reduction of local slippage between plates due to forces between the plates, such as frictional forces, which can in turn can reduce and/or prevent shrinkage of the circuit board.

Still another advantage of the aforementioned method can be reduction in exacerbation of differential contraction between plates and the PCB of the electronic structure through use of materials for the first plate or the second plate having a cryogenic contraction $C_M$ that is lower than that of the PCB.

In accordance with still another embodiment, a method for using a quantum computer can comprise operably coupling a quantum processor to an electronic structure comprising a circuit board a silicon chip electrically coupled to the circuit board and comprising physical components of a qubit, and a first plate and a second plate retaining the circuit board and the silicon chip therebetween, wherein the first plate and the second plate each have a cryogenic thermal contraction rate that is at least a factor of 0.5 lower than a cryogenic thermal contraction rate of the circuit board, and applying, by the quantum processor, a pulse to the silicon chip.

An advantage of the aforementioned method can be an ability to allow, with minimal or prevented damage to the silicon chip or to the solder bumps, use of the electronic structure at low temperatures, such as a cryogenic temperature of a dilution refrigerator of a cryogenic unit of a quantum computer. Such damage can be minimized and/or avoided because the low-contraction-rate first plate and second plates can be affixed firmly to the PCB, can hold the PCB in tension by virtue of frictional forces, and/or can minimize and/or prevent the PCB from contracting as much as the PCB would contract absent the first plate and the second plate. Thus, a differential contraction rate between the PCB and silicon chip can be reduced, thereby reducing and/or avoiding damage to the chip and/or to the solder bumps.

Another advantage of the aforementioned method can be reduction of local slippage between plates due to forces between the plates, such as frictional forces, which in turn can reduce and/or prevent shrinkage of the circuit board.

Another advantage can be reduction in exacerbation of differential contraction between plates and the PCB of the electronic structure through use of materials for the first plate or the second plate having a cryogenic contraction $C_M$ that is lower than that of the PCB.

In accordance with yet another embodiment, an electronic structure can comprise a circuit board, a silicon chip physically coupled to the circuit board by a plurality of solder bumps, and a first plate and a second plate retaining the circuit board and the silicon chip therebetween, wherein the first plate and the second plate each have a cryogenic thermal contraction rate that is lower than a cryogenic thermal contraction rate of the circuit board, and wherein a cryogenic thermal contraction rate of the silicon chip is less than the cryogenic thermal contraction rate of each of the first plate and the second plate.

An advantage of the aforementioned electronic structure can be an ability to allow, with minimal or prevented damage to the silicon chip or to the solder bumps, use of the electronic structure at low temperatures, such as a cryogenic temperature of a dilution refrigerator of a cryogenic unit of a quantum computer. Such damage can be minimized and/or avoided because the low-contraction-rate first plate and second plate can be affixed firmly to the PCB, can hold the PCB in tension by virtue of frictional forces, and/or can minimize and/or prevent the PCB from contracting as much as the PCB would contract absent the first plate and the second plate. Thus, a differential contraction rate between the PCB and silicon chip can be reduced, thereby reducing and/or avoiding damage to the chip and/or to the solder bumps.

Another advantage of the aforementioned electronic structure can be reduction of local slippage between plates due to forces between the plates, such as frictional forces, which can in turn can reduce and/or prevent shrinkage of the circuit board.

Still another advantage of the aforementioned electronic structure can be reduction in exacerbation of differential contraction between plates and the PCB of the electronic structure through use of materials for the first plate or the second plate having a cryogenic contraction $C_M$ that is lower than that of the PCB.

DETAILED DESCRIPTION

Figure 1:
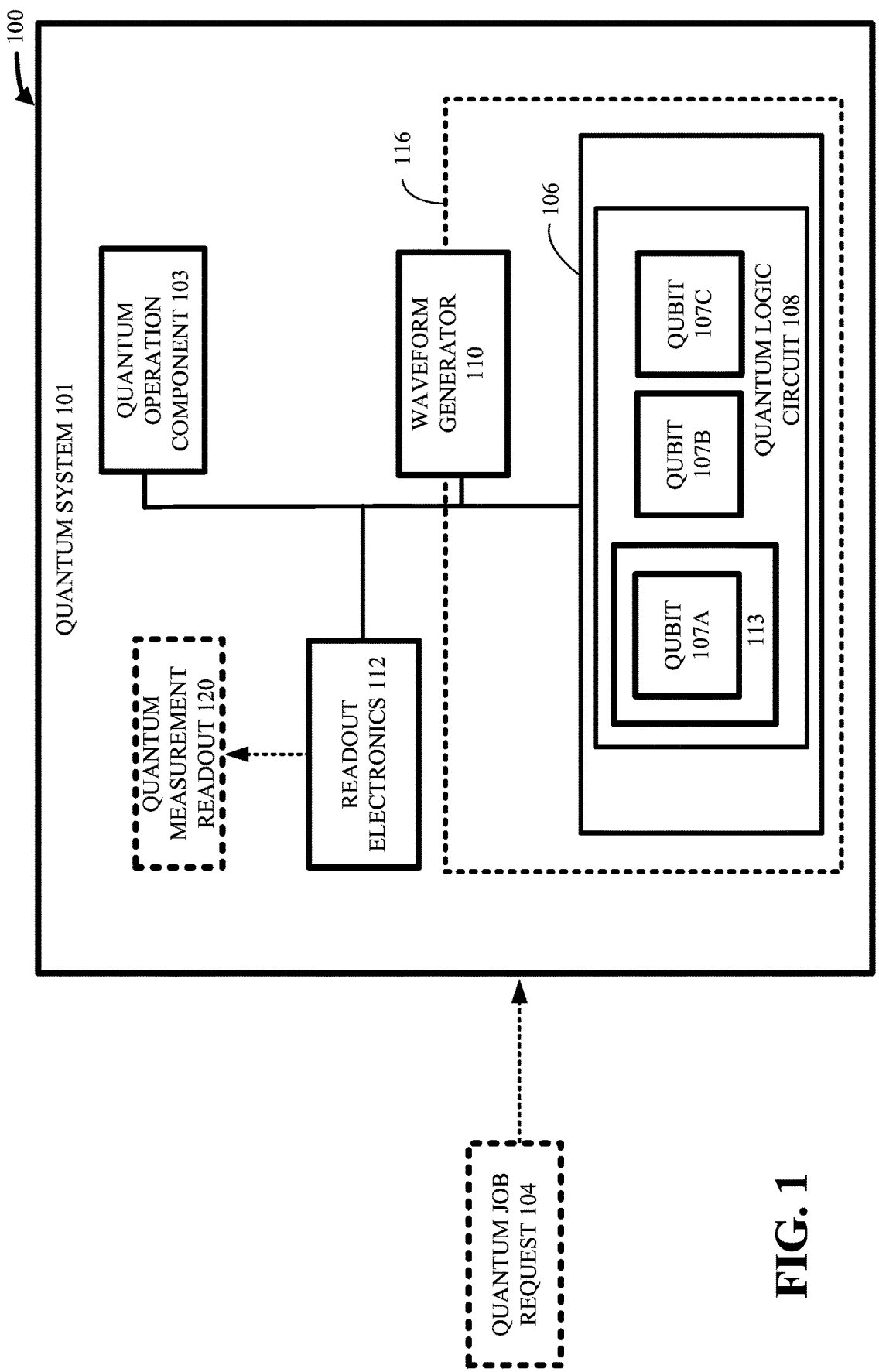
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section or in the Detailed Description section. One or more embodiments are now described with reference to the drawings, wherein like reference numerals are utilized to refer to like elements throughout. In the following description, for purposes of explanation, numerous details are set forth in order to provide a more thorough understanding of the one or more embodiments. However, in various cases, one or more embodiments can be practiced without these details.

Discussion is provided herein relative to configuration, including fabrication, of an electronic structure that can comprise and/or be comprised by a controller, payload and/or other chip-based structure. In one or more embodiments, the electronic structure can be configured for use in a quantum system, such as for use within a cryogenic unit and/or in a room temperature environment external to the cryogenic unit. However, as there are many uses for devices comprising silicon chips, the discussion herein need not apply solely to quantum computer electronics, but can also apply to many other control, radio, radar, cryogenic and/or signal-based applications, among others. Description and discussion herein is therefore not limited to use in a quantum computing system.

Turning first to existing frameworks for circuit building and/or circuit use, such as relative to superconducting electronic circuits, solder bumps can be used to electrically and/or mechanically interconnect a silicon chip (e.g., qubit chip or silicon interposer chip) to a printed circuit board (PCB), laminate and/or other substrate.

In quantum computing systems and/or other applications, a semiconductor chip and/or its support structure, can comprise a substrate to which a semiconductor chip is bonded as well as a plurality of bonding elements such as solder bumps, which can be exposed to large swings in temperature. As used herein, large can refer to 100's of degrees Kelvin (K). For superconducting quantum computing systems, the chip and its support structure can be cooled from a temperature of 300 Kelvin (K) to a cryogenic temperature, where a cryogenic temperature can be defined as any temperature below 123K. For example, superconducting qubit chips and their support structures can experience temperatures as low as 1 milli-Kelvin (mK).

At cryogenic temperatures, electronic devices can fail due to a physical phenomenon known as differential thermal contraction. Thermal contraction, also herein referred to as cryogenic thermal contraction, can be defined as when two materials denoted i and j are cooled from room temperature to milli-Kelvin temperature. The materials can contract at rates $C_i$ and $C_j$, respectively.

Contraction rates $C_i$ and $C_j$ can be measured in microns of contraction per millimeter of room temperature size. A cryogenic thermal contraction rate can refer to the shrinkage (in ρm/mm) from room temperature (300K) to a cryogenic temperature T. The differential contraction rate can be defined as $C_{dif}=C_i-C_j$. For example, for silicon (Si) $C_{si}$=about 0.22 μm/mm, whereas for copper (Cu) $C_{Cu}$=about 3.92 μm/mm. Thus, the differential contraction rate between copper and silicon is about 3.7 μm/mm. Consequently, a 25 mm×25 mm piece of copper can contract cryogenically (in each direction) by about 81 μm and a 25 mm×25 mm silicon piece can contract cryogenically (in each direction) by about 5.5 μm. thus, the differential amount of contraction can be about 75.5 μm. For most materials, during cryogenic cooldown from room temperature, a majority of the total contraction rate C can accrue between room temperature and the onset of the cryogenic environment (e.g., equal to or lesser than 123K), and nearly all accrues by 4K, as quantified by FIG. 3.17 of *Matter and Methods at Low Temperature* by Frank Pobell. If differential contraction rates between components of an assembly are too great, the associated induced stresses can cause one or more components to fail.

For example, a silicon qubit chip can be bonded to a silicon interposer chip with a first set of solder bumps, and the silicon interposer chip can be bonded to a PCB with a second set of solder bumps. However, the latter bond can incur the previously mentioned problem of differential thermal contraction. This can be because silicon has a low cryogenic contraction rate of $C_{si}$=0.22 μm/mm, whereas typical PCB materials such as glass-reinforced epoxy laminate material (FR4) have relatively high in-plane contraction rate of $C_{PCB}$≈1.9 to 2.4 μm/mm. Consequently, some of the second set of solder bumps can fail in shear as the PCB can shrink more than the silicon. This problem can be exacerbated by removal of heat from the PCB during cooldown, which can be achieved by a first plate and a second plate that abut the faces of the PCB sandwich-style, and which can be coupled to the PCB, such as by fasteners.

In one or more embodiments, a first plate and a second plate can be collectively referred to as a clamshell, however, this reference can be meant absent any hinge or connection at a common distal edge of the first plate and the second plate.

The first plate and the second plate can serve various purposes. First, the first plate and the second plate can provide an efficient heat flow path for removal of room temperature thermal energy contained in the PCB as the PCB is cooled to cryogenic temperature, a process known as thermalization. Second, the first and second plates can provide a symmetric structure that can reduce and/or avoid a differential thermal contraction-induced warping that can occur in bi-metal strips. Thermalization can be served by making the first plate and the second plate from copper (Cu) because copper has high thermal conductivity even at cryogenic temperatures. It is noted that, in one or more cases, copper plates can exacerbate the previously mentioned problem of differential thermal contraction because the cryogenic contraction rate for copper is 3.24 μm/mm, which is higher than the PCB's 1.9 to 2.4 μm/mm. Accordingly, this difference can encourage the PCB to contract even further than it would on its own, which can thereby further endanger stability of the solder bumps.

For example, during cryogenic cooling from 300K to 4K or less, a 25 mm×25 mm silicon chip can shrink by about 5.5 μm in each direction, whereas a same-sized portion of the PCB to which the silicon chip is attached can shrink by about 47.5 μm to about 60 μm in each direction. Where the PCB is firmly affixed to copper plates, the PCB can shrink even more, being encouraged to do so by the abutting copper because $C_{Cu}>C_{PCB}$.

That is, for mechanical support, the PCB can be retained, such as clamped between the aforementioned pair of copper plates having a cryogenic thermal contraction of $C_{Cu}$=3.2 μm/mm. This cryogenic thermal contraction of copper is higher than the cryogenic thermal contraction of the PCB, which can coax the PCB to contract slightly more than the PCB would on its own.

Solder bump failure can be more likely for peripheral solder bumps having a distance x from the center of the silicon chip that is larger than for other solder bumps closer to the center of the silicon chip. This can be because at such peripheral solder bumps, the differential displacement $d=(C_{Cu}-C_{PCB})*x$ between opposite bonding surfaces of a solder bump can be largest, and therefore a shear strain experienced by the peripheral solder bumps can be greatest.

For large silicon chips, such as those employed for accommodating a large number of qubits in a large quantum computing system, such as 10 or more qubits per silicon chip, the problem of solder bump failure can be additionally acute because peripheral bumps for larger chips can have larger distance x from the center of the respective silicon chips. This problem can be exacerbated (e.g., scaled) in larger electronic systems, such as larger quantum systems, having more qubits, more larger silicon chips, larger respective electronic structures, and thus greater chip-to-chip differential contraction along with overall aggregated differential contraction.

To account for one or more of these deficiencies of existing frameworks for electronic chip support, retainment and/or coupling, one or more embodiments described herein can provide a construction for attachment to a PCB that, while achieving sufficient thermalization and/or reduction in bi-metal warping, also can reduce and/or prevent, rather than exacerbate, differential thermal contraction between the PCB and the electronic chip.

The one or more embodiments described herein can be constructed to function at low temperatures, such as mK temperatures. Such one or more embodiments can allow for reduced and/or eliminated component-to-component shifting and/or slippage, reduced and/or eliminated shrinkage, and/or better static support of a respective electronic chip of such electronic structure. This can be accomplished by fabricating a first plate and a second plate for retaining the PCB and silicon chip therebetween from a material or combination of materials, generally denoted M, having an effective cryogenic thermal contraction rate $C_M$ that is less than $C_{PCB}$. In this way, the first plate and the second plate can cause the PCB to contract less than the PCB would on its own (that is, putting the PCB under tension), thereby bringing the effective PCB contraction rate closer to that of silicon. That is, the material or combination of materials denoted M, along with one or more additional construction elements described herein, can make the differential contraction problem better rather than worse, as compared to use of mere copper plates. Consequently, solder bump failure can be reduced and/or eliminated in applications where solder bump failure would otherwise occur. Likewise, an additional advantage can be reduction in and/or avoidance of cracking and/or other breaking of the respective silicon chip.

Generally, an electronic structure described herein can comprise a circuit board (e.g., PCB) and/or other laminate and/or substrate to which an electronic chip, such as a silicon chip, can be electrically coupled. The circuit board and the electronic chip can be retained between, such as clamped and/or bonded between, a first plate and a second plate. More particularly, the first plate and/or the second plate, such as both of the first plate and the second plate, can have a cryogenic thermal contraction rate that is lower than a cryogenic thermal contraction rate of the circuit board. As used herein, the term "cryogenic thermal contraction" can refer to the shrinkage and/or other material movement of a component due to exposure to cryogenic temperatures, such as exposure to sustained cryogenic temperature, such as during lowering to a cryogenic temperature.

In one or more embodiments, a cryogenic thermal contraction rate of at least the first plate or the second plate can be a factor of at least 0.5 times lower than a cryogenic thermal contraction rate of a respective circuit board coupled to the first plate or the second plate. For example, a cryogenic thermal contraction rate of a printed circuit board (PCB) can be a $C_{PCB}$ of about 1.9 μm/mm to about 2.4 μm/mm. Differently, first plates or second plates of tungsten can have $C_W$=0.7 μm/mm or of molybdenum can have $C_{Mo}$=0.92 μm/mm. For example, the first plate or the second plate can be comprised of majoratively molybdenum having a $C_{Mo}$ of about 0.92 μm/mm. In such case, $C_{Mo}$ can be about a factor of at least 0.5 lower than $C_P$CB, such as in a range of a factor of about 0.48 to about 0.38 times lower than $C_{PCB}$.

Generally, the first plate and/or the second plate can comprise tungsten, copper, Invar and/or molybdenum and can have two or more layers per plate. Invar is an iron-nickel alloy (FeNi) having a low cryogenic thermal contraction rate of about 0.50 μm/mm. The two or more layers can be fabricated employing physical methods, adhesive methods, explosion welding and/or electroplating, among other fabrication methods. The first plate and the second plate, relative to one another, can have different numbers of layers, different material layers, different peripheral dimensions, different thicknesses, different locating features and/or different manufacturing methods. For example, in one or more embodiments, the first plate and/or the second plate can comprise a plurality of layers of different materials, such as molybdenum-copper-molybdenum layers or copper-molybdenum-copper layers.

In one or more embodiments, the first plate, the second plate or the PCB can have a thickness (e.g., in a retaining force direction extending normally through each of the first plate, the second plate and the PCB) that is different than a thickness of at least one other of the first plate, the second plate and the PCB.

One or more cut outs, nests, slots and keys, pins and slots and/or other locating features can be provided at the first plate and/or the second plate. One or more fasteners, such as screws and/or bolts can provide a physical normal force on the PCB and/or electronic chip between the first plate and the second plate, thereby providing frictional forces that can retain the PCB in place, preventing the PCB from shrinking as much as it would in the absence of the plates. The one or more fasteners can apply a normal force across layers of the first plate or the second plate and/or across the PCB and/or electronic chip (e.g., between the first plate and the second plate). That is, the PCB can be held in tension by the first plate and the second plate, effectively reducing the magnitude of a cryogenic contraction rate of the PCB to a value closer to a cryogenic contraction rate of silicon of the electronic chip. This can reduce a differential contraction rate and hence reduce shear stress on the solder bumps that connect the electronic chip to the PCB.

To restrict and/or prevent thermal warping, the stack of material layers can be substantially symmetric about a central plane of the PCB, denoted as P. For example, if a first (e.g., bottom) plate has layers A-B-C, with layer C abutting the PCB's bottom surface, and the second (e.g., top) plate has layers D-E-F, with layer D abutting the PCB's top surface, then layers C and D can have substantially the same thickness and can be comprised of a same material. Likewise, layers B and E can have substantially the same thickness and can be comprised of a same material. Likewise, layers A and F can have substantially the same thickness and can be comprised of a same material. As a result, a stackup can be represented as A-B-C-P-D-E-F, with A and F being symmetric, B and E being symmetric, and C and D being symmetric.

In use, one or more embodiments discussed herein can retain the electronic chip in a stable and static position to allow for a pulse and/or other signal to be received by and/or directed at the electronic chip.

As used herein, the terms "on" and "above" can be used in a context, as is customary, to indicate orientation or relative position in a vertical or orthogonal direction to the surface of the substrate, for example in a vertical z-direction.

As used herein, the terms "lateral" and/or "laterally" can be used, as is customary, to indicate orientation generally parallel to the plane of the substrate, as opposed to generally vertically or outwardly, from the substrate surface.

As used herein, the terms "vertical" and/or "vertically" can be used, as is customary, to indicate orientation generally orthogonal (e.g., vertical z-direction) to the plane of the substrate, and thus also in a direction outward from the plane of the substrate, as opposed to generally laterally along the substrate surface.

As used herein, the term "arranged on/at" can be understood in a broad sense and shall include embodiments according to which an intermediate layer, such as an insulating layer, can be arranged between a substrate/ground plane/ground and a respectively described layer/structure. Hence the terms "arranged on" and/or "arranged at" can comprise the meaning of "arranged above."

As used herein, the terms "entity," "requesting entity" and "user entity" can refer to a machine, device, component, hardware, software, smart device and/or human.

As used herein, the term "electronic chip" can refer to, but must not always refer to, a silicon chip. As used herein, the term "silicon chip" can refer to a chip comprising silicon and/or any other material.

One or more embodiments are now described with reference to the drawings, where like referenced numerals are used to refer to like elements throughout. In the following description, for purposes of explanation, numerous details are set forth in order to provide a more thorough understanding of the one or more embodiments. However, in various cases, that the one or more embodiments can be practiced without these details.

Generally, the subject computer processing system, methods, apparatuses, devices and/or computer program products can be employed to solve new problems that can arise through advancements in technology, computer networks and/or the Internet.

Further, the one or more embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning first generally to FIG. 1, one or more embodiments described herein can include one or more devices, systems and/or apparatuses that can facilitate executing one or more operations to facilitate generation of one or more qubit drive, excitation and/or readout pulses (e.g., signals, waveforms and/or wavelets). FIG. 1 illustrates a block diagram of an example, non-limiting system 100 that can facilitate operation of a quantum circuit such as by employing an electronic structure 113 according to the present disclosure. The electronic structure 113 can be employed at the readout electronics, waveform generator 110, logic circuit 108, quantum processor 106 and/or at any other suitable location of the quantum system 101, within and/or external to the cryogenic environment 116.

The following/aforementioned description refer to the operation of a single quantum program from a single quantum job request. This operation can include one or more readouts from cryogenic environment electronics within cryogenic chamber 116 by room temperature control/readout electronics 112 external to the cryogenic chamber 116. That is, one or more of the processes described herein can be scalable, also such as including additionally, and/or alternatively, execution of one or more quantum programs and/or quantum job requests in parallel with one another. Scalability can be enabled by employing electronic structures 113 in quantity.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function at least partially in parallel with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

In one or more other embodiments, the classical system can provide a quantum job request 104, qubit mapping and/or quantum circuit to be executed. Such classical system can analyze the one or more quantum measurement readouts 120. Further, such classical system can manage a queueing of quantum circuits to be operated on the one or more qubits of the quantum logic circuit of a respective quantum system 101.

Figure 15:
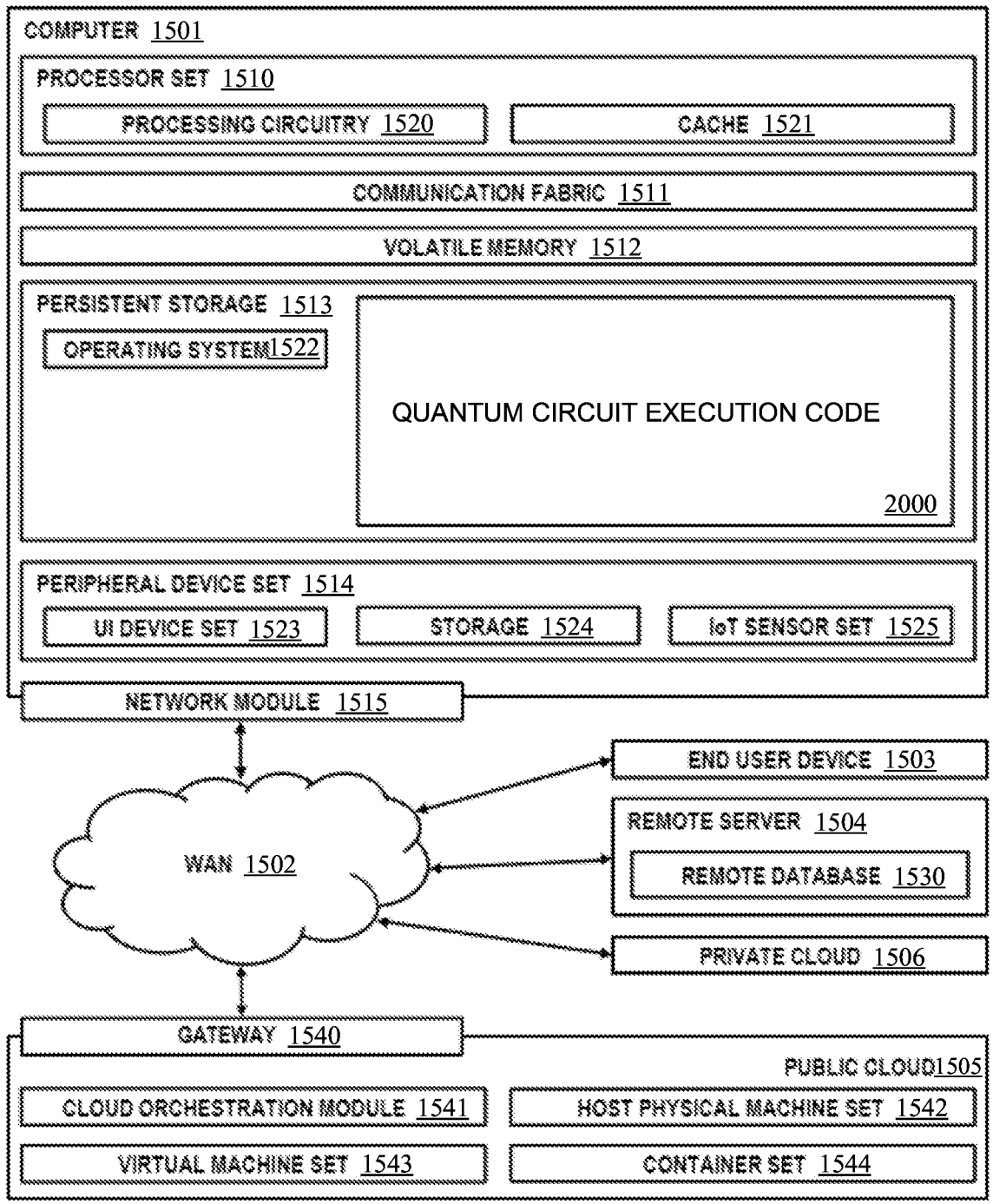
FIG. 15 illustrates a block diagram of example, non-limiting, computer environment in accordance with one or more embodiments described herein.

For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 1500 illustrated at FIG. 15. In one or more described embodiments, computer and/or computing-based elements can be used in connection with implementing one or more of the systems, devices, components and/or computer-implemented operations shown and/or described in connection with FIG. 1 and/or with other figures described herein.

The quantum system 101 (e.g., quantum computer system and/or superconducting quantum computer system) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

As used herein, a quantum circuit can be a set of operations, such as gates, performed on a set of real-world physical qubits with the purpose of obtaining one or more qubit measurements. A quantum processor can comprise the one or more real-world physical qubits. Operation of a quantum circuit can be facilitated, such as by a waveform generator 110, to produce one or more physical pulses and/or other waveforms, signals and/or frequencies to alter one or more states of one or more of the physical qubits. The altered states can be measured, thus allowing for one or more computations to be performed regarding the qubits and/or the respective altered states. The waveform generator can be controlled, such as by a respective control stage.

In one or more embodiments, the quantum system 101 can comprise one or more quantum components, such as a quantum operation component 103, a quantum processor 106, quantum readout/control electronics 112, the waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum logic circuit 108 and/or waveform generator 110.

The quantum operation component 103 can obtain (e.g., download, receive and/or search for) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more waveform for operating and/or affecting one or more quantum circuits on the one or more qubits 107A, 107B and/or 107C. For example, the waveform generator 110 can operate one or more qubit effectors, such as qubit oscillators, harmonic oscillators and/or pulse generators to cause one or more pulses to stimulate and/or manipulate the state of the one or more qubits 107A, 107B and/or 107C comprised by the quantum system 101.

Employing the electronic structure 113, one or more physical qubit components (e.g., of the one or more qubits 107A, 107B and/or 107C) can be retained in a stable and static position relative to one another and/or relative to waveform generator electronics, at room temperatures, cryogenic temperatures and temperatures therebetween. As used herein, room temperature can be between 60 degrees Fahrenheit and 80 degrees Fahrenheit, such as about 70 degrees Fahrenheit. That is, as noted above, the electronic structure 113 can be constructed for use in a cryogenic environment, such as the cryogenic chamber 116, such as at temperatures in the mK's.

The waveform generator 110, such as at least partially in parallel with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 and/or quantum processor 106 can be contained in a cryogenic environment, such as generated by a cryogenic chamber 116, such as a dilution refrigerator. Indeed, a signal can be generated by the waveform generator 110 to affect the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110 also are to be constructed to perform at such cryogenic temperatures.

Turning now to FIGS. 2-12, illustrated are enlarged views of varying embodiments of electronic structures formed during one or more stages of fabrication methods according to embodiments of the present disclosure. Such electronic structures can be employed as electronic structure 113, as described above relative to a quantum system 101, and/or can be employed as an electronic structure (e.g., an electronic chip support, retainment and/or coupling structure) for other suitable purposes, such as electronic payload purposes, signal-based purposes, control unit purposes, cryogenic and/or signal generating purposes.

Generally, each of the electronic structures discussed herein can comprise a substrate, such as a laminate and/or circuit board, an electronic chip comprising silicon (also herein referred to as a silicon chip) retained at the substrate, and a pair of plates that abut the opposing major faces of the substrate, such as sandwich-style or clamshell-style. In one or more embodiments, coupling of the pair of plates and the substrate can be made by way of fasteners, such as screws.

The electronic chip can comprise an interposer chip, qubit chip, semiconductor chip and/or silicon chip.

Each electronic structure embodiment described below can comprise different aspects relative to one or more other embodiments, but one or more teachings described relative to any one electronic structure embodiment can be applied to any one or more other electronic structure embodiments.

The figures referenced each provide but single illustrations of electronic structures. Thus, in use, an electronic structure described can be scalable to include additional or fewer fasteners, larger and/or smaller dimensions, different component shapes and/or more than one silicon chip.

Furthermore, any two or more of the embodiments described herein can be used at least partially in parallel with one another. For example, an electronic structure 200 can be employed at a same system (e.g., quantum system) as an electronic structure 500, 800 and/or 1000.

Figure 2:
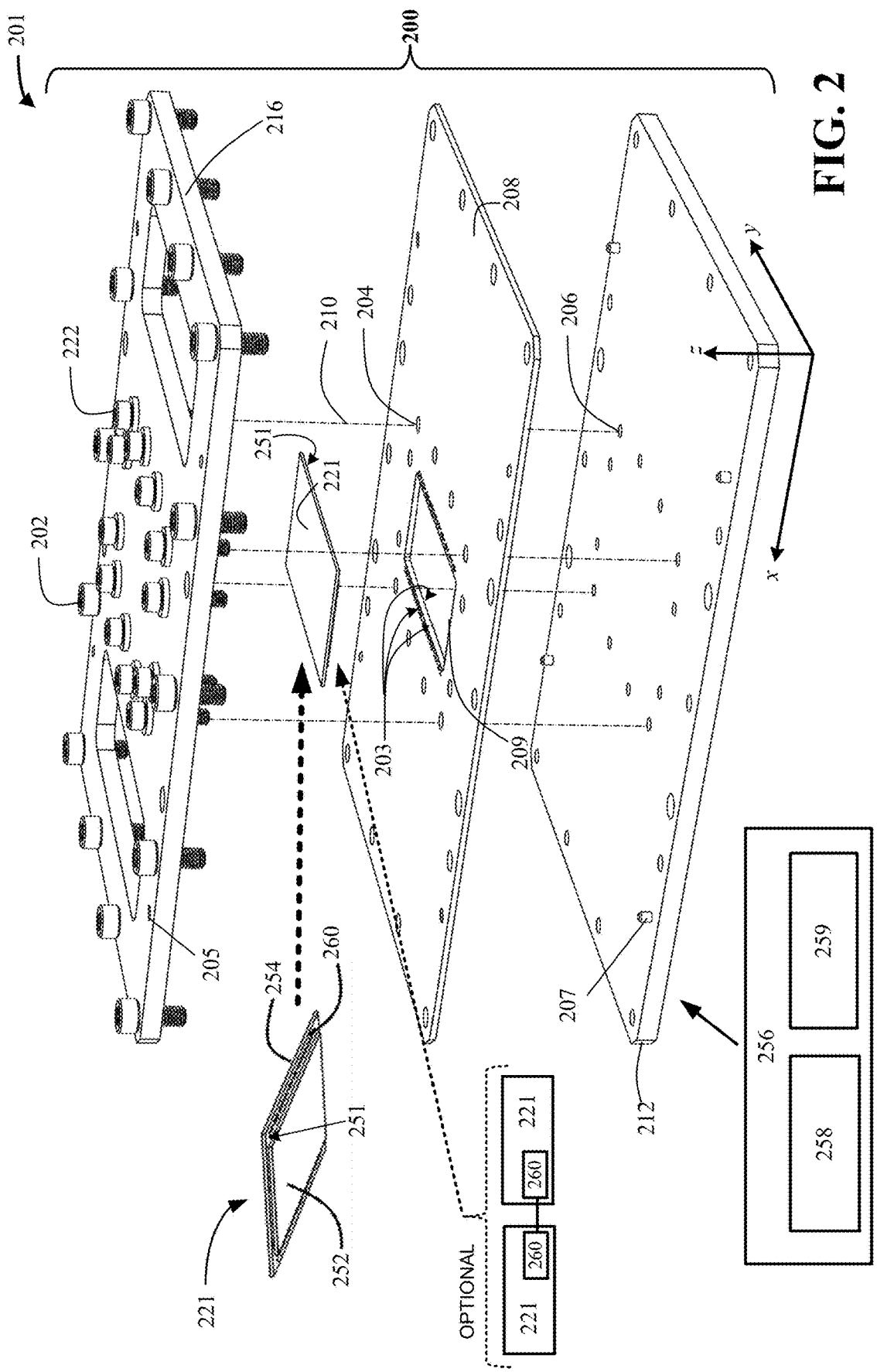
FIG. 2 illustrates an electronic structure, in accordance with one or more embodiments described herein.

Turning now to FIG. 2, but applicable to any of FIGS. 2-12 and to any electronic structure 200, 500, 800 and/or 1000, in one or more embodiments, one or more operations for fabricating the one or more electronic structures described herein, such as the electronic structure 200, can be performed by a manufacturing system, such as a manufacturing system 256 (also herein referred to as fabrication system 256) comprising one or more manufacturing devices 258, where the manufacturing system 256 is operatively coupled to a processor 259 for at least partially controlling the one or more operations. The processor 259 can be any suitable processor. Discussion proved below with respect to processor 1510 can be at least partially equally applicable to the processor 259.

In one or more embodiments, the manufacturing system 256 can be configured, such as by one or more operations performed by one or more of the manufacturing devices 258 in view of one or more instructions provided by the processor 259, to construct the electronic structure 200, such as relative to and/or on a substrate. The one or more manufacturing devices 258 can, perform, among other operations, one or more deposition, transfer, etching, cutting, placement, removal, radiation, irradiation, adhesive operations, metallization operations, welding such as explosion welding, electroplating and/or other plating methods, component location and/or fastener attachment.

As used herein, the term "explosion welding" can refer to a welding operation in which chemical explosives can be used to cause two or more metal layers to impact each other at high velocity, thereby providing clean, intimate, strong welds between the several layers.

Figure 3:
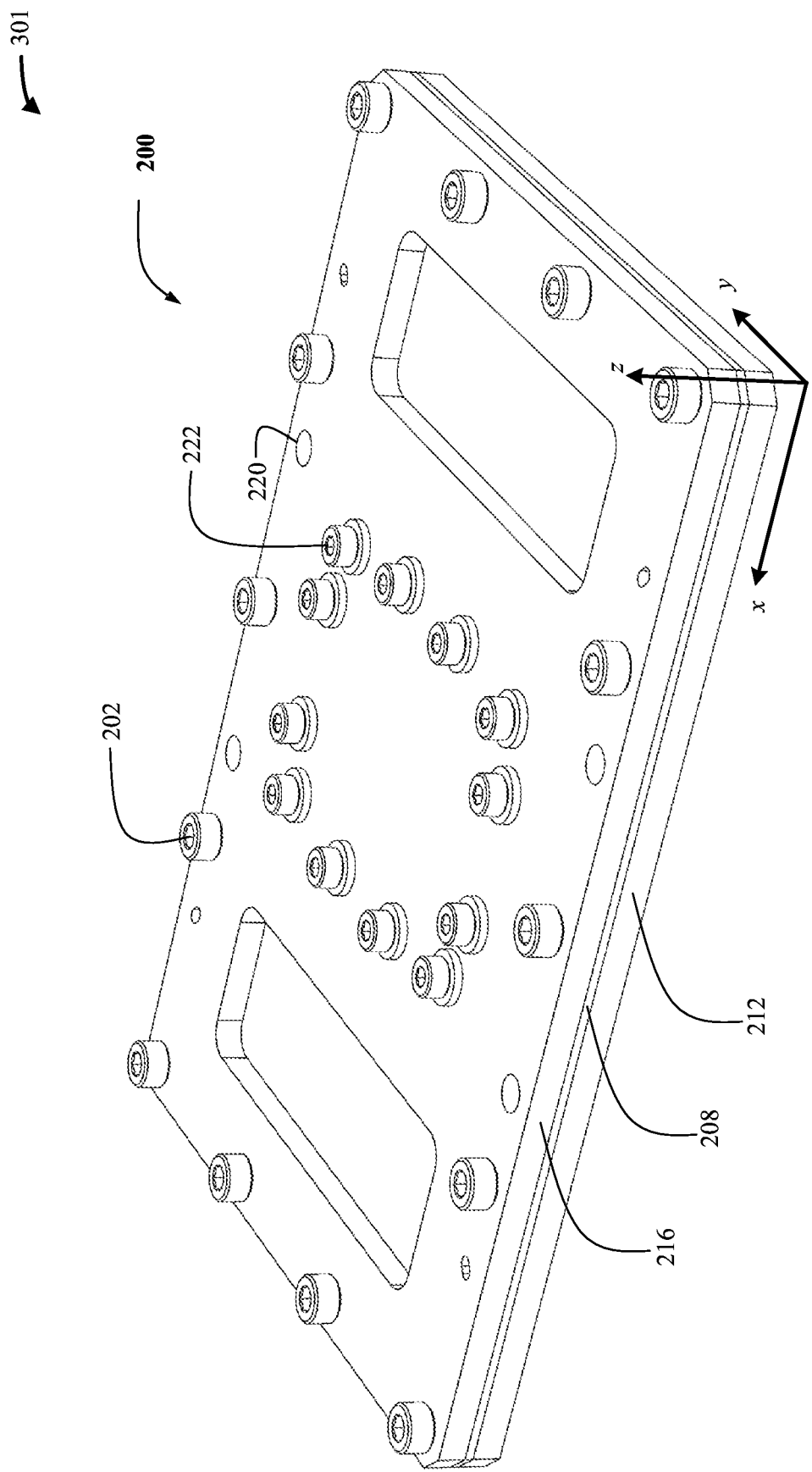
FIG. 3 illustrates another view of the electronic structure of FIG. 2, in accordance with one or more embodiments described herein.
Figure 4:
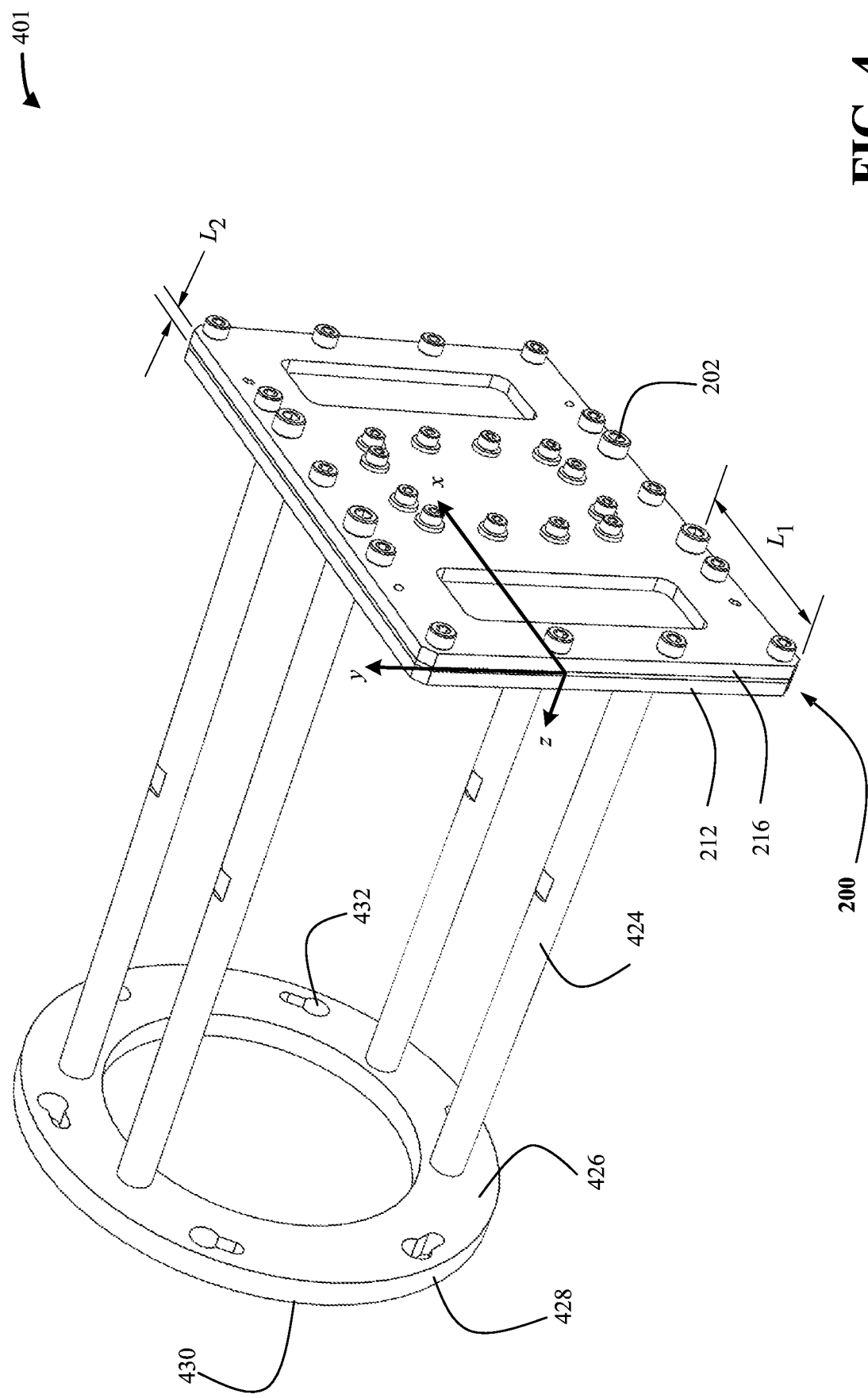
FIG. 4 illustrates yet another view of the electronic structure of FIG. 2, in accordance with one or more embodiments described herein.

Turning next to FIGS. 2-4 (and to views 201, 301 and 401), an electronic structure 200 is illustrated. View 201 (FIG. 2) provides an exploded view, while view 301 (FIG. 3) provides an assembled view of electronic structure 200.

Electronic structure 200 can comprise a circuit board (PCB) 208, an electronic chip 221 such as a circuit chip, silicon chip, qubit chip and/or interposer chip. The electronic chip 221 can be electrically coupled at the PCB 208, such as at a retaining location 209 (e.g., hole, nest, cut out) of the PCB 208. For example, the electronic chip 221 can be accommodated by PCB cut out 209 and can be coupled, such as electrically and/or mechanically, to PCB 208 by a plurality of solder bumps at one or more locations 203. In one or more embodiments, such solder bumps 260 can depend from a surface of chip 221, such as surface 251. Electronic structure 200 further can comprise a first plate 212 and a second plate 216.

In one or more embodiments, the electronic chip 221 can comprise both a qubit chip 252 and an interposer chip 254 coupled to one another by solder bumps (not shown due to being between the qubit chip 252 and the interposer chip 254).

The first plate 212 and/or the second plate 216 can comprise at least one locator 207, and the other of the first plate 212 and the second plates 216 can comprise at least one receiver slot 205 for receiving the locator 207. As shown, the first plate 212 includes four locators 207, such as dowel pins, and the second plate 214 includes four corresponding receiver slots 205 (e.g., holes, such as elongated holes). Receiver slots 205 need not extend fully through the second plate 216. Additionally, and/or alternatively, the second plate 216 can comprise one or more locators 207 and the first plate 212 can comprise one or more receiver slots 205.

Additionally, and/or alternatively, different size sets of locators and receiver slots can be used in parallel with one another.

Also as shown, the first plate 212 or the second plate 216 can comprise at least one fastener-receiving hole (at location of fasteners 202) for receiving a fastener 202. In an embodiment, the fastener can be a bolt or a screw. The other of the first plate 212 or the second plate 216 can comprise at least one fastener hole 206, which can be threaded, for receiving the fastener 202.

As shown, the second plate 216 can comprise a plurality of fastener-receiving holes at an intermediary section of the second plate 216, bounding, such as at least partially surrounding, the electronic chip 221 (e.g., bounding a location of the PCB 208 at which the electronic chip 221 is located when the PCB 208 is retained, such as clamped, between the first plate 212 and the second plate 216).

Also as shown, the first plate 212 can comprise a plurality of fastener holes 206, for receiving the plurality of fasteners 222, also at an intermediary section of the first plate 212, bounding the electronic chip 221 in the same manner as the fastener-receiving holes of the second plate 216. In one or more embodiments, at least one fastener hole 206 can be shaped to allow a fastener to pass therethrough for attachment of a nut to the fastener at an opposite side of the first plate 212. Fastener holes 206 need not extend fully through the first plate 212. Additionally, and/or alternatively, the second plate 216 can comprise one or more fastener holes and the first plate 212 can comprise one or more fastener-receiving holes.

Additionally, and/or alternatively, different size bolts and/or screws can be used in parallel with one another.

To lessen and/or fully avoid the aforementioned differential thermal contraction, the first plate 212 and the second plate 216 can be comprised of a material "M" having a cryogenic contraction rate $C_M$, measured for example in microns of contraction per millimeter of room-temperature dimension, which is lower than a cryogenic contraction rate $C_{PCB}$ of PCB 208. That is, $C_M<C_{PCB}$. Consequently, the first plate 212 and the second plate 216 can mitigate the problem of differential contraction rather than exacerbating it as do high-contraction copper plates where the following would instead apply: $C_{Cu}>C_{PCB}$.

This mitigation can be achieved because the first plate 212 and the second plate 216 can be bound tightly to PCB 208, adjacent electronic chip 221, by a plurality of high-yield-strength fasteners 222 and/or 202, such as screws. As used herein, "high-yield-strength" can refer to 800 MPa, for example. In one or more embodiments, one or more fasteners 222 and/or fasteners 202 can be comprised of titanium, such as Ti-6A1-4V (Grade 5 titanium).

Fasteners 222 can pass through an array of corresponding clearance holes 204 in PCB 208 into a corresponding array of holes 206 (e.g., threaded holes) in first plate 212, as indicated by a set of imaginary dashed lines 210 representing alignments between first plate 212, PCB 208, and second plate 216. In one or more embodiments, fasteners 222 can be torqued almost to their respective yield points, thereby creating, between first plate 212, second plate 216 and PCB 208, a large normal force (along a direction of the dashed lines 210) and hence large frictional forces (in directions x and y), that can restrict or prevent slippage of PCB 208 with respect to the first plate 212 and the second plate 216, such as during cool down from room temperature to cryogenic temperature.

Upon cryogenic cooling of the structure 200, the frictional forces between the first plate 212 and the second plate 216 can restrict and/or prevent, about chip 221, such as within a boundary of the fasteners 222, local slippage between first plate 212, second plate 216 and PCB 208. As used here, "upon" can refer to during and/or after.

Furthermore, because of the equation $C_M<C_{PCB}$, the frictional force thereby can limit and/or prevent PCB 208 from shrinking as much as it otherwise would in the absence of the first plate 212 and the second plate 216. This concept can be analogous to a drum, in which PCB 208 can act like a drumhead and first plate 212 and second plate 216 can act like a drum body, where the drumhead (PCB) is held in tension (stretched) by the drum body (plates). This technique can be further effective if the first plate 212 and the second plate 216 have greater thickness and higher Young's modulus than PCB 208, such that first plate 212 and second plate 216 can mechanically dominate the PCB 208, much like a drum body dominates a drumhead by virtue of mechanical strength. Young's modulus can refer to the slope of a stress-strain curve of a material in an elastic region (e.g., at low strain), and can employ units of GPa.

In one or more embodiments, the material M can have a cryogenic-contraction rate $C_M$ that can be less than that of the PCB 208 having $C_{PCB}$ of about 1.9 μm/mm to about 2.4 μm/mm. Material M can be readily machinable, can have acceptable thermal conductivity even at low cryogenic temperatures (e.g. 20 mK), and can be non-ferromagnetic to avoid interfering with qubit operation. The thermal conductivity can limit the choice to metals. Metals with low cryogenic contraction can comprise Invar ($C_{Invar}$=0.5 μm/mm), pure tungsten ($C_W$=0.72 μm/mm), and pure molybdenum ($C_{Mo}$=0.92 μm/mm). However, invar is ferromagnetic, and thus can affect operation of qubits. It is noted that pure tungsten can be difficult and costly to machine, as well as being extremely heavier than copper and molybdenum and expensive.

In one or more embodiments, molybdenum can be employed for material M, and thus each of the first plate 212 and second plate 216 can be at least partially, such as fully, comprised of molybdenum. $C_{Mo}$ of about 0.92 μm/mm can be somewhat higher than $C_W$ of 0.72 μm/mm, but still below $C_{PCB}$ of about 1.9 μm/mm to about 2.4 μm/mm, and thus can serve to minimize and/or prevent differential contraction between PCB 208 and electronic chip 221. Molybdenum can be easier and less costly to machine than tungsten, and molybdenum can be less costly to procure as a raw material. Moreover, the density of molybdenum ($\rho_{Mo}$=10,220 kg/m$^3$) is about half that of tungsten ($\rho_W$=19,300 kg/m$^3$), making it more practical where electronic structure weight is a concern.

In one or more embodiments, the first plate 212 and/or the second plate 216 can have a thickness in a range of about 2 mm to about 6 mm, such as about 5 mm. In one or more embodiments, such thickness can correspond with the first plate 212 and/or the second plate 216 being comprised of molybdenum, such as majoratively molybdenum, such as about 51% to about 100% molybdenum, such as about 85% molybdenum or about 100% molybdenum.

In one or more embodiments, the first plate 212 and/or the second plate 216 can be at least partially coated (e.g., plated) with one or more layers of copper, titanium, silver and/or gold.

Looking briefly to FIG. 3, different or same fasteners 202 can be employed at an outer periphery of the electronic structure 200 than at a central/intermediary section of the electronic structure 200 where fasteners 222 can be employed.

Turning now to FIG. 3 and FIG. 4 and to view 401, one or more fasteners can pass through a set of through holes 220 at the assembled electronic structure 200, and thus can extend through the second plate 216, the PCB 208 and first plate 212 to a plurality of standoffs 424, such as copper standoffs. The distal end of each standoff 424 can be affixed to a first surface 426 of a ring 428. A second surface 430 of ring 428 can be affixed by fasteners (not shown) passing through a plurality of holes 432 to a cryogenic chamber plate, such as a mixing-chamber plate (not shown), of a dilution refrigerator (not shown) of a quantum system (e.g., quantum system 101).

An advantage of the electronic structure 200 can be an ability to limit and/or prevent failure of electronic chip 221 and/or respective solder bumps, such as during use at low temperatures, such as a cryogenic temperature of a dilution refrigerator of a cryogenic unit of a quantum computer. For example, first plate 212 and second plate 216 can be comprised of low-contraction materials and/or can be coupled (e.g., mechanically fixed) to the PCB 208 such as to minimize cryogenic contraction of PCB 208 by maintaining PCB 208 under tension. This can minimize differential contraction between the PCB 208 and the plates of the electronic structure 200.

Another advantage of the electronic structure 200 can be reduction of local slippage between plates due to forces between the plates, such as frictional forces, which can in turn can reduce and/or prevent shrinkage of the circuit board.

Still another advantage of the electronic structure 200 can be reduction in exacerbation of differential contraction between plates of the electronic structure through use of materials for at least the first plate or the second plate having a cryogenic contraction $C_M$ that is lower than that of the circuit board.

Figure 5:
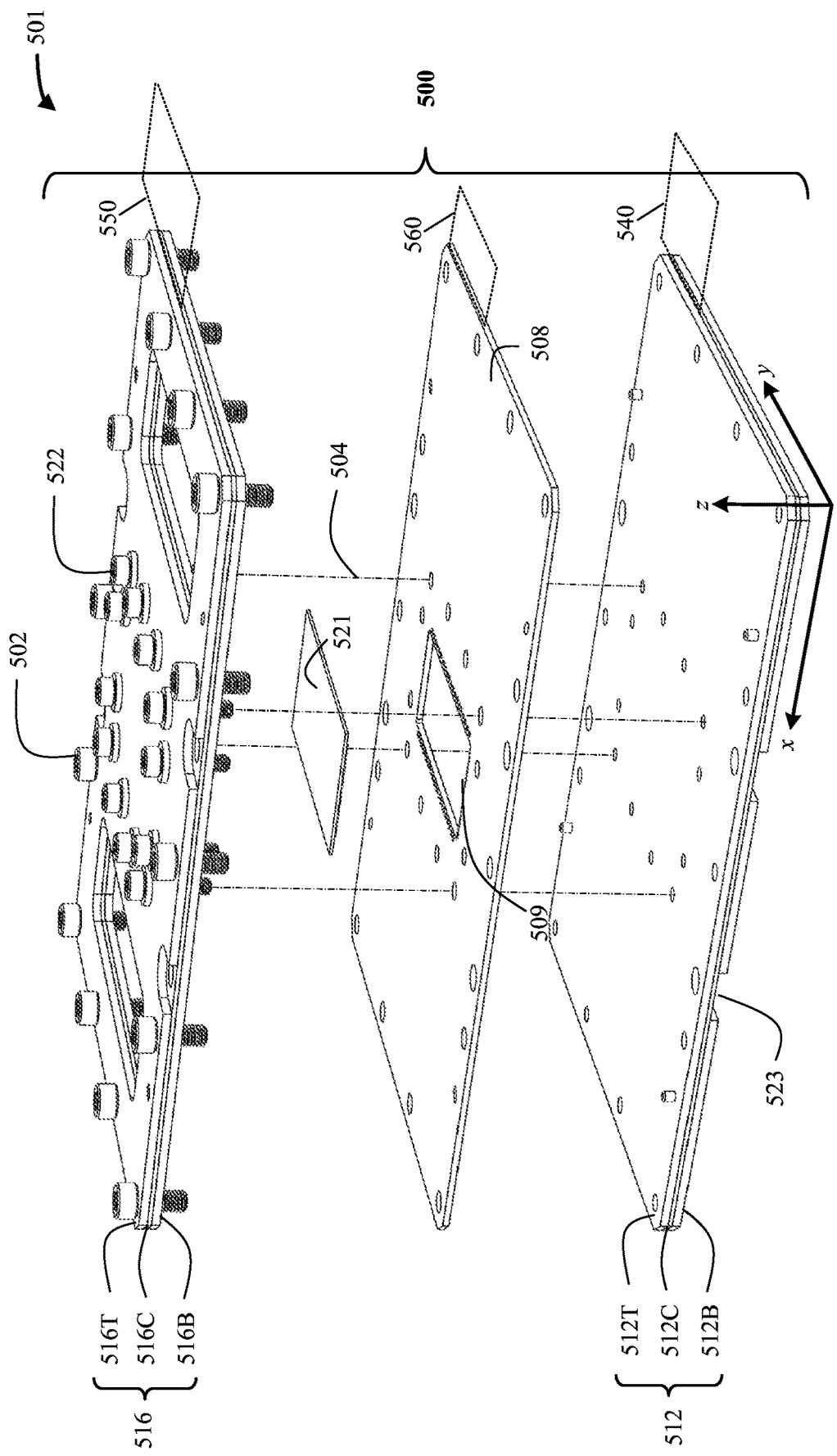
FIG. 5 illustrates another electronic structure, in accordance with one or more embodiments described herein.
Figure 6:
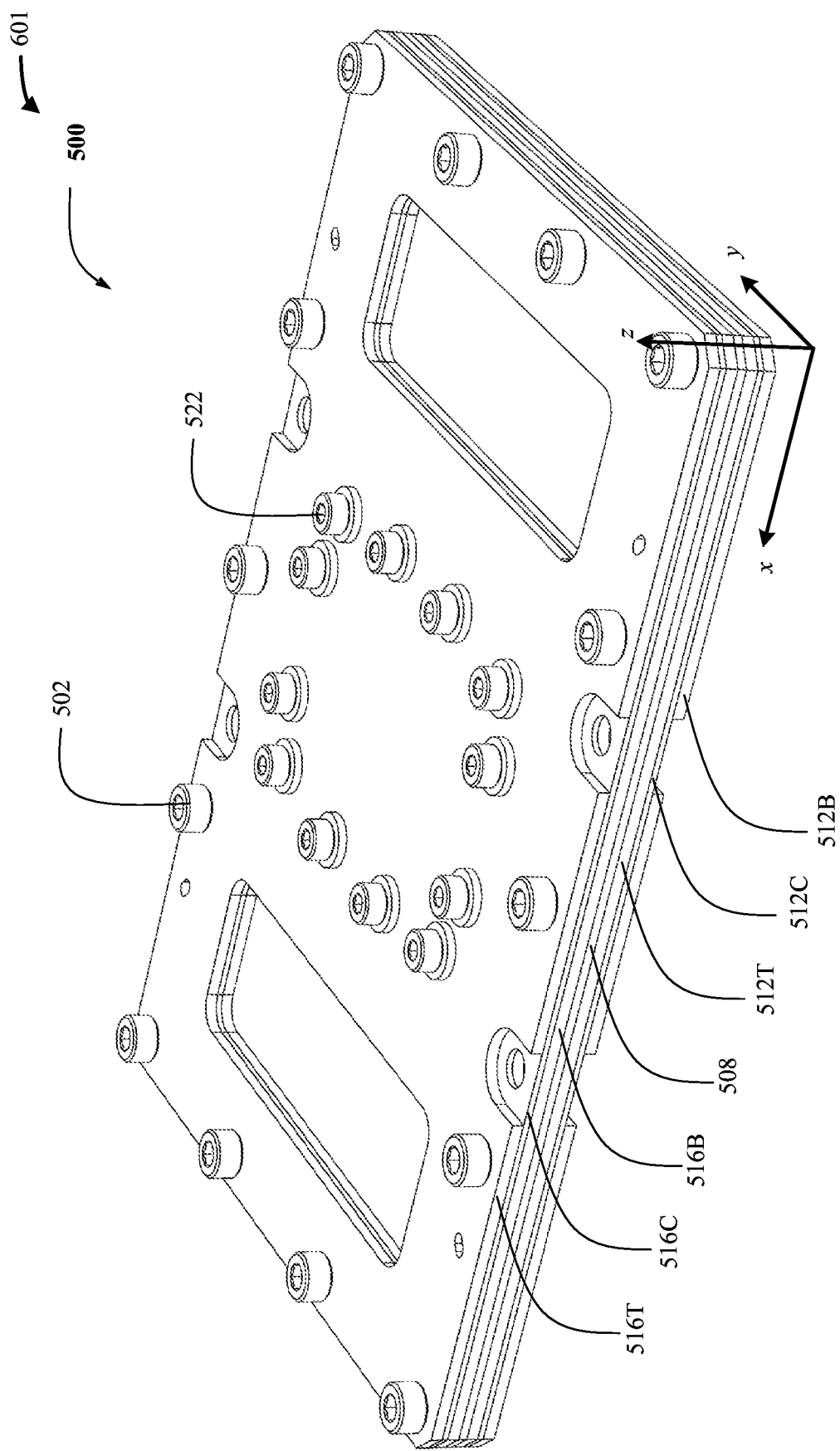
FIG. 6 illustrates another view of the electronic structure of FIG. 5, in accordance with one or more embodiments described herein.
Figure 7:
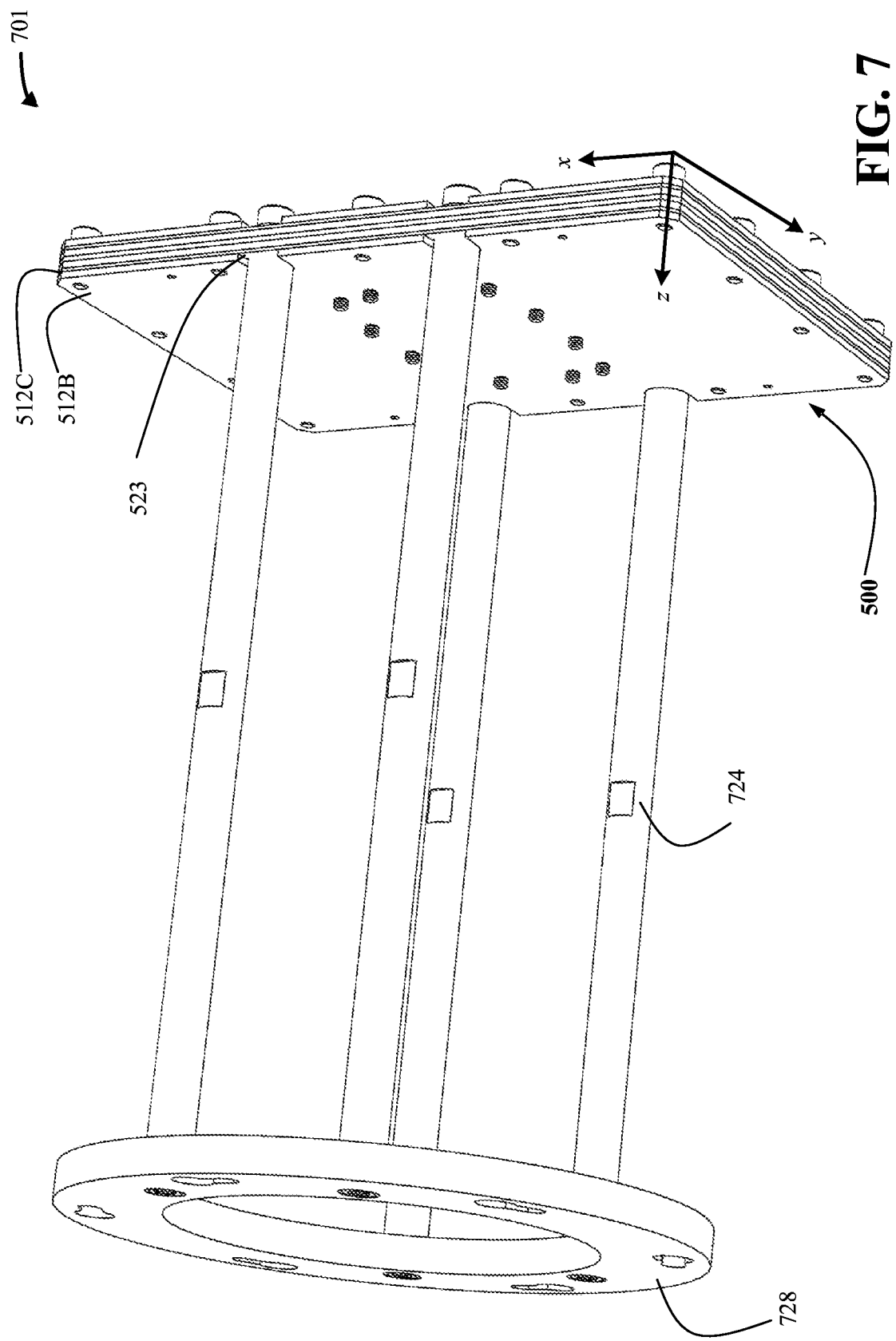
FIG. 7 illustrates still another view of the electronic structure of FIG. 5, in accordance with one or more embodiments described herein.

Referring now to FIGS. 5 to 7 (and to views 501, 601 and 701), an electronic structure 500 can comprise a circuit board 508, electronic chip 521 such as a silicon chip, circuit chip, electronic chip, qubit chip and/or interposer chip, a first plate 512 and a second plate 516. The electronic chip 521 can be coupled, such as electrically and/or mechanically coupled, at the PCB 508, such as at a retaining location 509 (e.g., hole, nest, cut out) of the PCB 508. Repetitive description of like elements and/or processes employed in electronic structure embodiments 200 and 500 is omitted for sake of brevity.

It is noted that molybdenum can superconduct when at a temperature below about 0.92K. Accordingly, molybdenum can have a thermal conductivity at such low temperatures that can lead to unacceptably long thermalization time, defined as the time required to cool the qubits to a low cryogenic temperature (e.g., 20 mK).

To explain this issue in more detail, two observations are explained here defining associated heat transfer.

First, the rapidity of a transient-heat-transfer process such as thermalization does not depend per se on thermal conductivity k of a heat-transporting medium. Rather, it can depend on the medium's thermal diffusivity $\alpha=k/(\rho*c)$, where $\rho$ is density and c is specific heat. For molybdenum, density $\rho$=10,220 kg/m$^3$ is not a function of temperature, whereas k and c are more temperature dependent, particularly at cryogenic temperatures. For many materials at low temperature, although k and c both can decline dramatically as temperature is lowered, they do so in tandem, such that thermal diffusivity $\alpha$, because it depends on the ratio k/c, can substantially plateau to a constant value at low temperature. Thus, for molybdenum, one can assume $\alpha_{Mo}$ (20 mK)≈$\alpha_{Mo}$ (1K). At 1K, molybdenum's thermal conductivity $k_{Mo}$ (1K) ≈15 W/m-K and its specific heat $c_{Mo}$ (1K)≈1.9 mJ/mole-K=0.02 J/kg-K, where $\alpha_{Mo}$ (20 mK)≈$\alpha_{Mo}$ (1K)≈0.07 m$^2$/s. This can be lower than the low-temperature diffusivity of copper ($\alpha_{Cu, RRR=300}$=300=4 m$^2$/s). Consequently, a thermalization time for first plate 212 and second plate 216 being comprised of entirely molybdenum can be longer than desired for setting a temperature of a cryogenic unit.

Second, a time constant r for transient heat-transfer processes can be $\tau=L^2/\alpha$, where L is a characteristic length in the direction of heat transport. That is, for first plate 212 and second plate 216 at electronic structure 200, if heat can travel to heat-sinking standoffs 424 via a long, in-plane dimension $L_1$ (FIG. 4), then an associated thermalization time $\tau_1$ can be undesirably long. Differently, if heat were to be able to reach a high-thermal-diffusivity copper via a short, plate-thickness dimension $L_2$ (FIG. 4), then an associated thermalization time $\tau_2$ can be shorter than $\tau_1$. In one or more embodiments, $\tau_2$ can be shorter than $\tau_1$ by the ratio of the square of the two lengths: $\tau_2/\tau_1 = (L_2/L_1)^2$. For example, if $L_1 \sim 100$ mm whereas $L_2 \sim 2$ mm, then $\tau_2$ can be a factor of 2500 shorter than $\tau_1$.

Electronic structure 500 can exploit the above-provided second observation to avoid the concern of the above-provided first observation. That is, referring to FIG. 5, the first plate 512 can be a multi-layer plate, such as a laminated plate, comprising a plurality of layers, such as two or more layers.

As illustrated, these layers can comprise a first layer 512B, second layer 512T and intermediary layer 512C. First layer 512B can comprise Mo and second layer 512T can comprise Mo while intermediary layer 512C can comprise materials other than Mo, such as copper (Cu). In one or more embodiments, first layer 512B can comprise only Mo, second layer 512T can comprise only Mo and intermediary layer 512C can comprise only Cu.

That is, at least one of the first plate 512 or the second plate 516 can comprise a plurality of layers comprising at least a first layer comprising molybdenum and a second layer comprising copper. For example, each of the first plate 512 and the second plate 516 can comprise at least three layers comprising a first layer, a second layer and a middle (e.g., intermediary) layer disposed between the first layer and the second layer, where the first layer comprises one of molybdenum or copper, the second layer comprises the same one of molybdenum or copper as the first layer, and the middle layer comprises the other of molybdenum or copper.

Referring to the electronic structure 500 shown in exploded view 501 (FIG. 5) and assembled view 601 (FIG. 6), during thermalization (e.g., during lowering of temperature of the electronic structure 500 to low temperatures such as cryogenic temperatures), heat contained in either of the molybdenum layers 512B or 512T of the first plate 512 can travel a short distance (e.g., approximately $L_2$), such as a distance (along dotted lines 504) that is at most equal to a thickness of the molybdenum layers 512B and 512T, to reach the faster-heat-sinking copper layer 512C.

The second plate 516 also can be a multi-layer plate, such as a laminated plate, comprising a plurality of layers, such as three layers. These layers can comprise a first layer 516B, second layer 516T and intermediary layer 516C. First layer 516B can comprise Mo and second layer 516T can comprise Mo while intermediary layer 516C can comprise materials other than Mo, such as copper (Cu). In one or more embodiments, first layer 516B can comprise only Mo, second layer 516T can comprise only Mo and intermediary layer 516C can comprise only Cu.

Thus, during thermalization, heat contained in either of the molybdenum layers 516B or 516T of second plate 516 can travel a short distance, such as at most equal to the thickness of the molybdenum layers 516B and 516T to reach the faster-heat-sinking copper layer 516C.

As illustrated at FIG. 7 and view 701, and also at FIG. 6 and view 601, each standoff 724, such as copper standoff 724, can abut the copper layer 512C due to notches 523 in first layer 512B, thereby limiting and/or avoiding an additional heat flow path through a lower-thermal-diffusivity molybdenum layer, such as the first layer 512B.

Turning now to fabrication of the first plate 512 and second plate 516, each of the first plate 512 and the second plate 516 can comprise three layers rather than two layers to limit and/or avoid a bi-metal strip warping effect associated with differential thermal contraction.

First plate 512, comprising Mo—Cu—Mo layers 512B-512C-512T, can be symmetric across a center plane 540 of copper layer 512C. That is the Mo layers 512B and 512T can have a same thickness, and in one or more cases, also can have a same material composition. Likewise, second plate 516, comprising Mo—Cu—Mo layers 512B-512C-512T, can be symmetric across a center plane 550 of copper layer 516C. That is the Mo layers 516B and 516T can have a same thickness, and in one or more cases, also can have a same material composition.

Further, the electronic structure 500 can be symmetric across a center plane 560 of the PCB 508, such as to further limit and/or avoid a bi-metal strip warping effect and/or differential thermal contraction between plate layers.

Consequently, on cooling to cryogenic temperatures, less or no warping can occur in either first plate 512 or second 516 by virtue their respective symmetries. Moreover, referring to FIG. 6, because first plate 512 and second plate 516 can be similarly constructed with similar or identical layer thicknesses, less and/or no warping can occur in assembled electronic structure 500, such as due to symmetry of the assembled electronic structure 500.

The Mo—Cu—Mo lamination of first plate 512 and of second plate 516 can be accomplished, in one or more embodiments, by explosion welding. This technology can produce blank, multi-layer plates from which first plate 512 and second plate 516 can be later machined. That is, after a controlled explosion process, the three layers of Mo—Cu—Mo can be machined into first plate 512 and second plate 516, and thus the three layers of Mo—Cu—Mo can be permanently bonded to one another.

In one or more embodiments, the first plate 512 can have a first layer 512B and/or a second layer 512T having a thickness in a range of about 1 mm to about 4 mm, such as about 2 mm. Additionally and/or alternatively, in one or more embodiments, the second plate 516 can have a first layer 516B and/or a second layer 516T having a thickness in a range of about 1 mm to about 4 mm, such as about 2 mm. In one or more embodiments, such thicknesses can correspond with the first layer 512B, first layer 516B, second layer 512T and/or second layer 516T being comprised of molybdenum, such as majoratively molybdenum, such as about 51% to about 100% molybdenum, such as about 85% molybdenum or about 100% molybdenum.

Additionally, and/or alternatively, in one or more embodiments, the first plate 512 can have an intermediary layer 512C having a thickness in a range of about 1 mm to about 4 mm, such as about 1 mm or such as about 2 mm. Additionally, and/or alternatively, in one or more embodiments, the second plate 516 can have an intermediary layer 516C having a thickness in a range of about 1 mm to about 4 mm, such as about 1 mm or such as about 2 mm. In one or more embodiments, such thicknesses can correspond with the intermediary layer 512C and/or the intermediary layer 516C being comprised of copper, such as majoratively copper, such as about 51% to about 100% copper, such as about 85% copper or about 100% copper.

In one or more other embodiments, at least one of the first plate 512 or the second plate 516, such as both of the first plate 512 and the second plate 516 can comprise different layered construction of Cu—Mo—Cu rather than of Mo—Cu—Mo. That is, as one example, first layer 512B can comprise majoratively and/or only Cu, intermediary layer 512C can comprise majoratively and/or only Mo, and second layer 512T can comprise majoratively and/or only Mo.

In one or more embodiments, however, layering of Mo—Cu—Mo, as opposed to layering of Cu—Mo—Cu, can be advantageous. First, more molybdenum can be better than less molybdenum for reducing differential thermal contraction of PCB 508, so two layers of Mo can be better than one in a first plate 512 and/or second plate 516. Second, having Mo layers, rather than Cu layers, abutting the surfaces of PCB 508 can aid to minimize the contraction of the PCB 508.

Further, it is noted that the any one or more of the Mo and Cu layers described above of the first plate 512 and/or second plate 516 can comprise a majority of the respective material (metal) rather than only the respective material (metal). In one or more other embodiments, any one or more of the Mo and/or Cu layers described above of the first plate 512 and/or second plate 516 can comprise 50% to 100%, such as about 85%, or such as about 100% of the respective material (metal).

An advantage of the electronic structure 500 can be an ability to limit and/or prevent failure of electronic chip 521 and/or respective solder bumps when structure 500 is used at low temperatures, such as a cryogenic temperature of a dilution refrigerator of a cryogenic unit of a quantum computer. For example, first plate 512 and second plate 516 can be comprised of low-contraction materials, be layered and/or can be coupled (e.g., mechanically fixed) to the PCB 508 such as to minimize cryogenic contraction of PCB 508 by maintaining PCB 508 under tension. This can minimize differential contraction between the PCB 508 and additional plate layers of the electronic structure 500.

Yet another advantage of the electronic structure 500 can be reduction of local slippage between plates due to forces between the plates, such as frictional forces, which can in turn can reduce and/or prevent shrinkage of the circuit board.

Still another advantage of the electronic structure 500 can be reduction in exacerbation of differential contraction between plates of the electronic structure through use of materials for at least the first plate or the second plate having a cryogenic contraction $C_M$ that is lower than that of the circuit board.

Another advantage of the electronic structure 500 can be efficient thermal transport from a mounting assembly (e.g., standoffs 724 and ring 728) to the electronic structure 500, such as due to the layering and use of notches 523 of the first plate 512 and the second plate 516.

Figure 8:
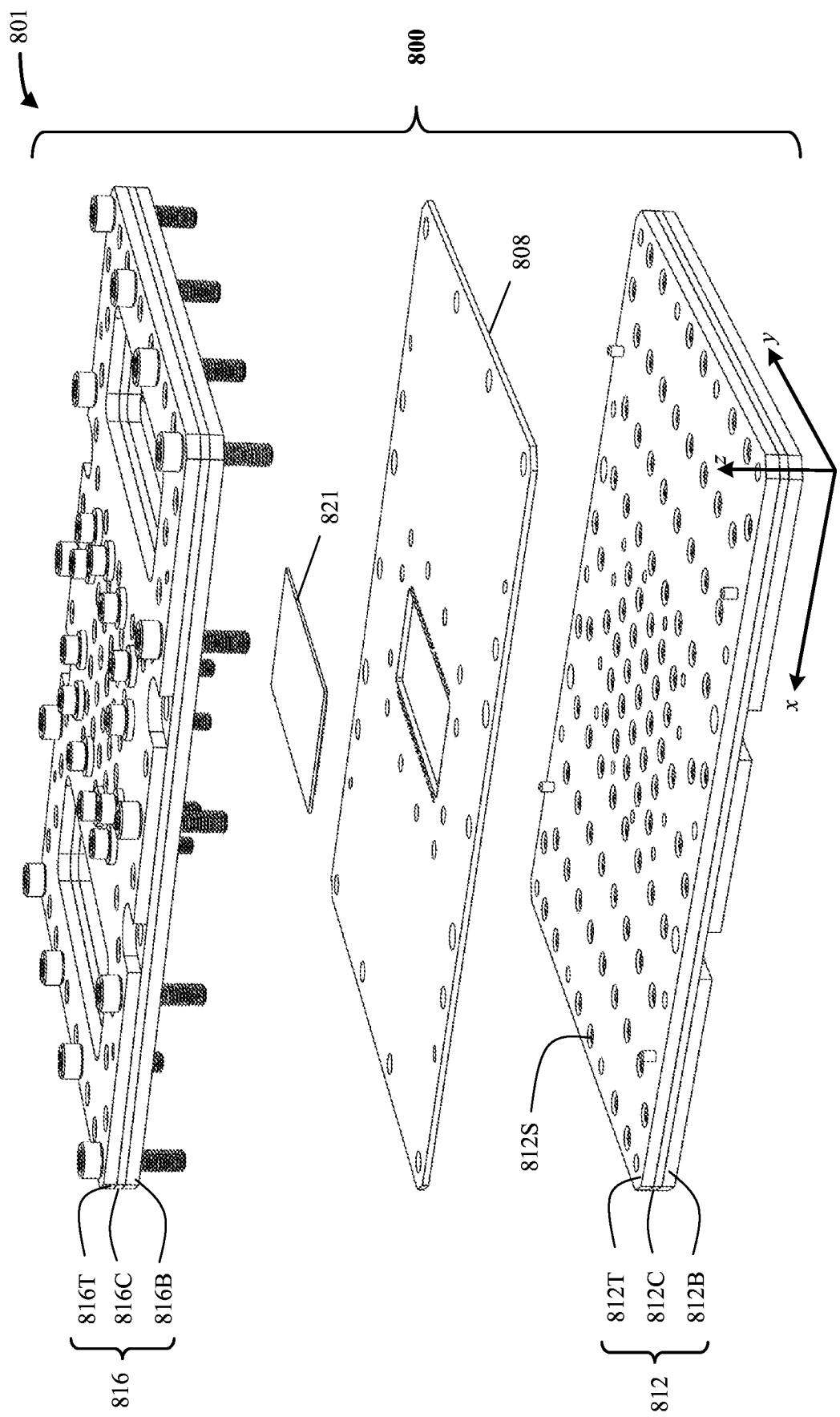
FIG. 8 illustrates still another electronic structure, in accordance with one or more embodiments described herein.
Figure 9:
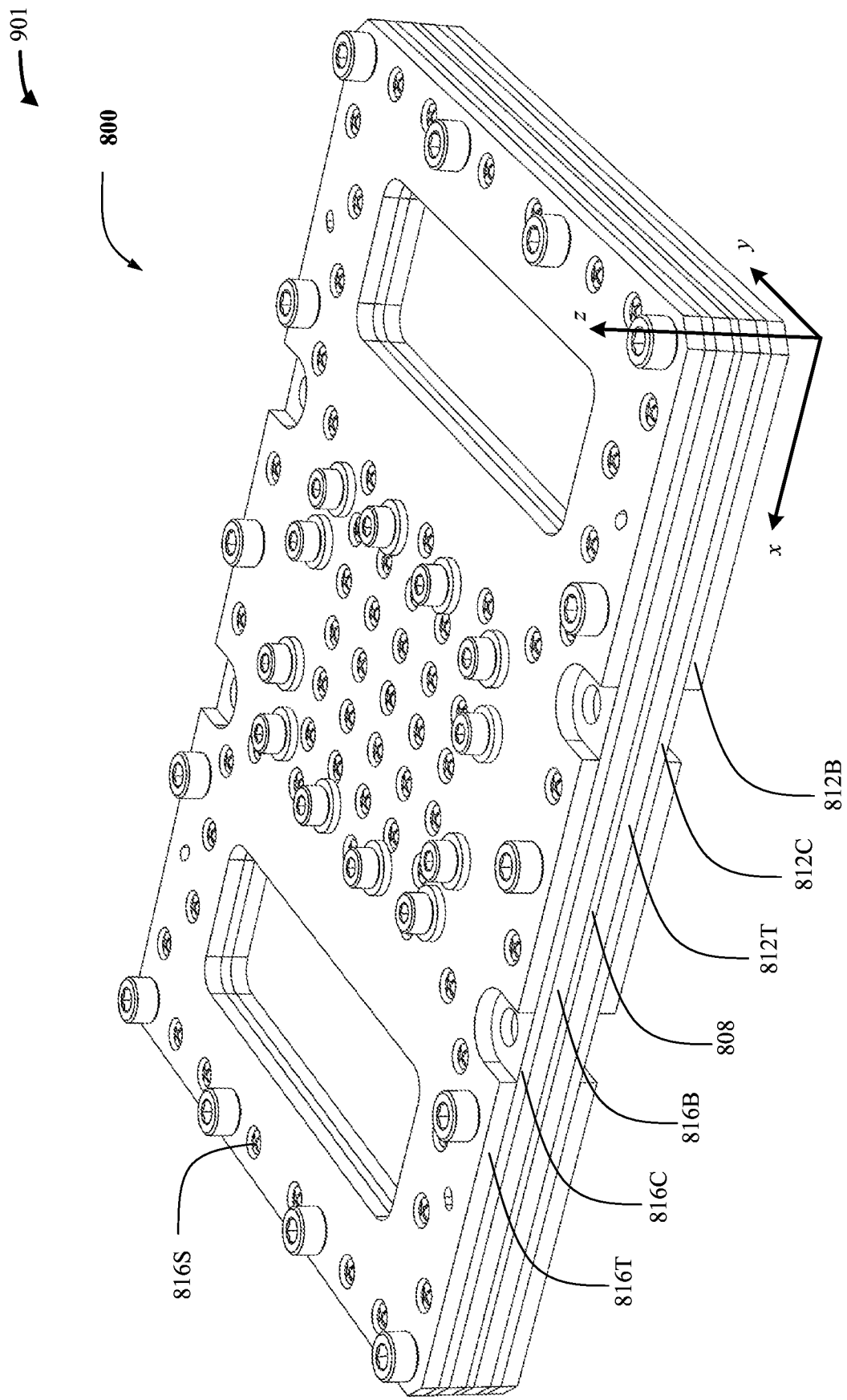
FIG. 9 illustrates another view of the electronic structure of FIG. 8, in accordance with one or more embodiments described herein.

Turning now to FIGS. 8 and 9 (and to views 801 and 901), an electronic structure 800 can comprise a circuit board 808, electronic chip 821 such as a silicon chip, circuit chip, electronic chip, qubit chip and/or interposer chip, a first plate 812 and a second plate 816. The electronic chip 821 can be coupled, such as electrically and/or mechanically, at the PCB 808. Repetitive description of like elements and/or processes employed in electronic structure embodiments 200, 500 and 800 is omitted for sake of brevity.

It is noted that explosion welding of the first plate 512 and/or the second plate 516 of the electronic structure 500 can cause the molybdenum layers to crack if the molybdenum is overly thick, such as more than twice as thick as a corresponding Cu layer. Moreover, explosion welding can compromise flatness of the first plate 512 and/or the second plate 516, which flatness can cause failure of mating at corresponding features of the first plate 512, second plate 516 and/or PCB 508, such as relative to through-holes, holes, pins, keys, slots, cut outs, etc. (e.g., failure of soldering of the electronic chip 521 to the PCB 508).

Differently, at electronic structure 800, for applications where one or both or these issues is problematic, in place of explosion welding, additional binding fasteners can be employed to bind together the layers of the first plate 812 and/or additional binding fasteners can be employed to bind together the layers of the second plate 816. These binding fasteners can comprise screws and/or bolts.

As shown at FIG. 8, first plate 812 can comprise Mo—Cu—Mo layers 812B-812C-812T and second plate 816 can comprise Mo—Cu—Mo layers 816B-816C-816T. In one or more other embodiments, either of the first plate 812 and/or the second plate 816 can comprise layering of Cu—Mo—Cu.

As indicated above, rather than use of explosion welding, first plate 812 further comprises a plurality of binding fasteners 812S, such as binding screws, that can bind layers 812B, 812C, 812T to provide good thermal contact therebetween, and thereby to achieve a short thermal path $L_2$ (FIG. 4) from molybdenum plates 812B and 812T to copper plate 812C. Fasteners 812S can obviate the use of explosion welding of first plate 812. Fasteners 812S (FIG. 8) can further allow molybdenum layers 812B and 812T to be thicker than allowable by explosion welding. Tightening of the binding fasteners 812S can provide for sufficient thermal contact between the layers 812B-812C-812T, to thereby achieve a short thermal path from Mo to Cu.

Second plate 816 similarly, rather than use of explosion welding, can comprise a plurality of binding fasteners, such as screws, 816S (FIG. 9) that can bind layers 816B, 816C, 816T to provide good thermal contact therebetween, and thereby to achieve the short thermal path $L_2$. Fasteners 816S can obviate the use of explosion welding of second plate 816. Fasteners 816S also can allow molybdenum layers 816B and 816T to be thicker than allowable by explosion welding. Tightening of the binding fasteners 816S can provide for sufficient thermal contact between the layers 816B-816C-816T, to thereby achieve a short thermal path (e.g., $L_2$) from Mo to Cu.

A pattern of arrangement of the fasteners 816S along the second plate 816 and/or a pattern of arrangement of the fasteners 812S along the first plate 812 can be any suitable pattern. The pattern of arrangement of the fasteners 816S can match the pattern of arrangement of the fasteners 812S or can be different therefrom. As illustrated, the patterns match and comprise a plurality of, e.g., thirteen, rows of fasteners extending along the x-axis of the first plate 812 and the second plate 816, with the rows being arranged substantially parallel to one another. Any other number of fasteners, number of rows, row arrangement, etc. can be used where suitable.

In one or more embodiments, the first plate 812 can have a first layer 812B and/or a second layer 812T having a thickness in a range of about 2 mm to about 6 mm, such as about 3 mm. Additionally, and/or alternatively, in one or more embodiments, the second plate 816 can have a first layer 816B and/or a second layer 816T having a thickness in a range of about 2 mm to about 6 mm, such as about 3 mm. In one or more embodiments, such thicknesses can correspond with the first layer 812B, first layer 816B, second layer 812T and/or second layer 816T being comprised of molybdenum, such as majoratively molybdenum, such as about 51% to about 100% molybdenum, such as about 85% molybdenum or about 100% molybdenum.

Additionally, and/or alternatively, in one or more embodiments, the first plate 812 can have an intermediary layer 812C having a thickness in a range of about 0.5 mm to about 3 mm, such as about 2 mm. Additionally, and/or alternatively, in one or more embodiments, the second plate 816 can have an intermediary layer 816C having a thickness in a range of about 0.5 mm to about 3 mm, such as about 2 mm. In one or more embodiments, such thicknesses can correspond with the intermediary layer 812C and/or the intermediary layer 816C being comprised of copper, such as majoratively copper, such as about 51% to about 100% copper, such as about 85% copper or about 100% copper.

An advantage of the electronic structure 800 can be an ability to limit and/or prevent failure of electronic chip 821 and/or respective solder bumps when structure 800 is used at low temperatures, such as a cryogenic temperature of a dilution refrigerator of a cryogenic unit of a quantum computer. For example, first plate 812 and second plate 816 can be comprised of low-contraction materials, be layered and/or can be coupled (e.g., mechanically fixed) to the PCB 808 such as to minimize cryogenic contraction of PCB 808 by maintaining PCB 808 under tension. This can minimize differential contraction between the PCB 808 and additional plate layers of the electronic structure 800.

Another advantage of the electronic structure 800 can be reduction of local slippage between plates due to forces between the plates, such as frictional forces, which can in turn can reduce and/or prevent shrinkage of the circuit board.

Still another advantage of the electronic structure 800 can be reduction in exacerbation of differential contraction between plates of the electronic structure through use of materials for at least the first plate or the second plate having a cryogenic contraction $C_M$ that is lower than that of the circuit board.

Yet another advantage of the electronic structure 800 can be reduced opportunity for material cracking during manufacturing, such as due to the use of the bonding fasteners 812S and 816S at the first plate 812 and second plate 816, respectively. In one or more embodiments, this can allow for stable mounting to a respective mounting assembly (not shown).

Figure 10:
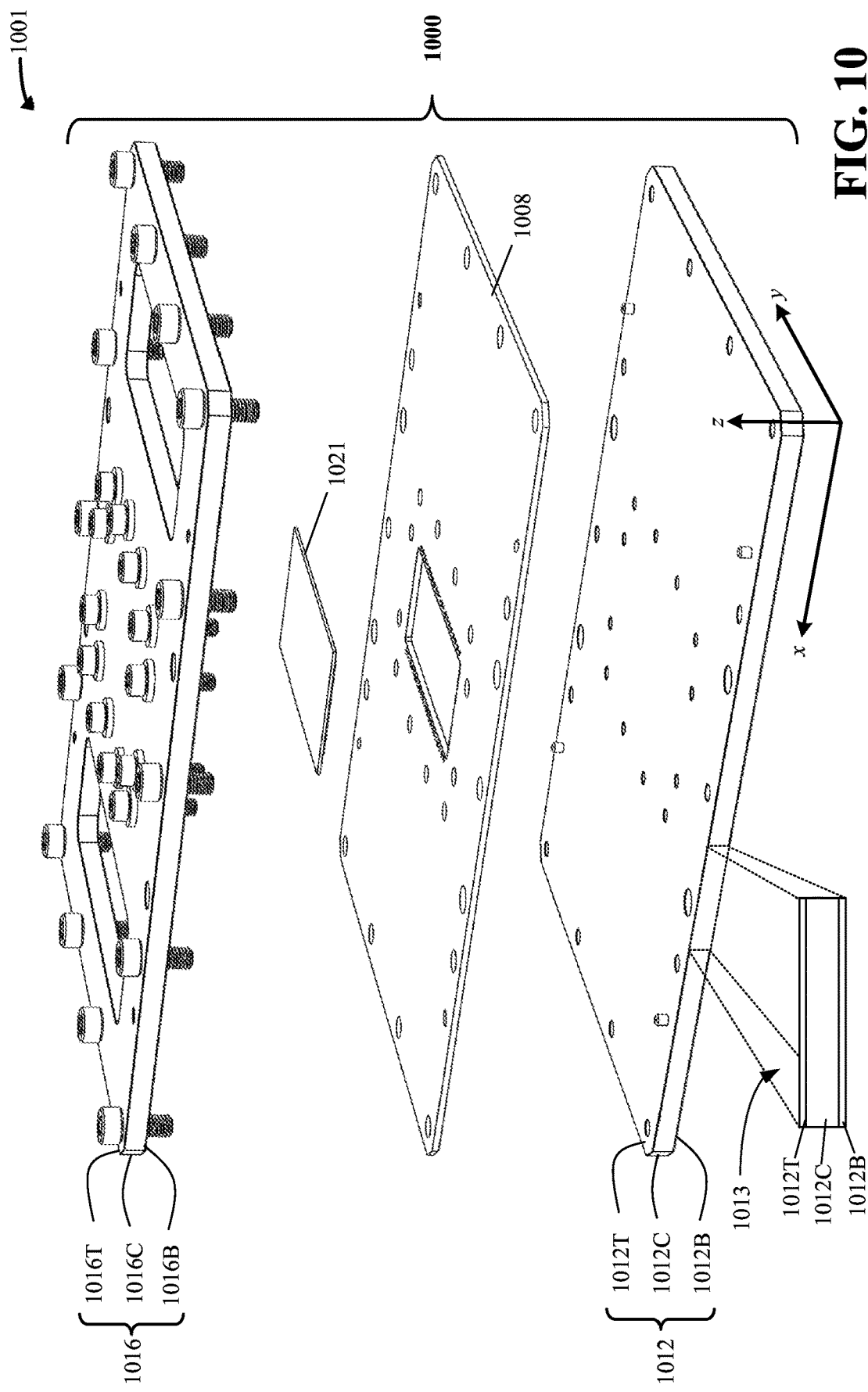
FIG. 10 illustrates another electronic structure, in accordance with one or more embodiments described herein.
Figure 11:
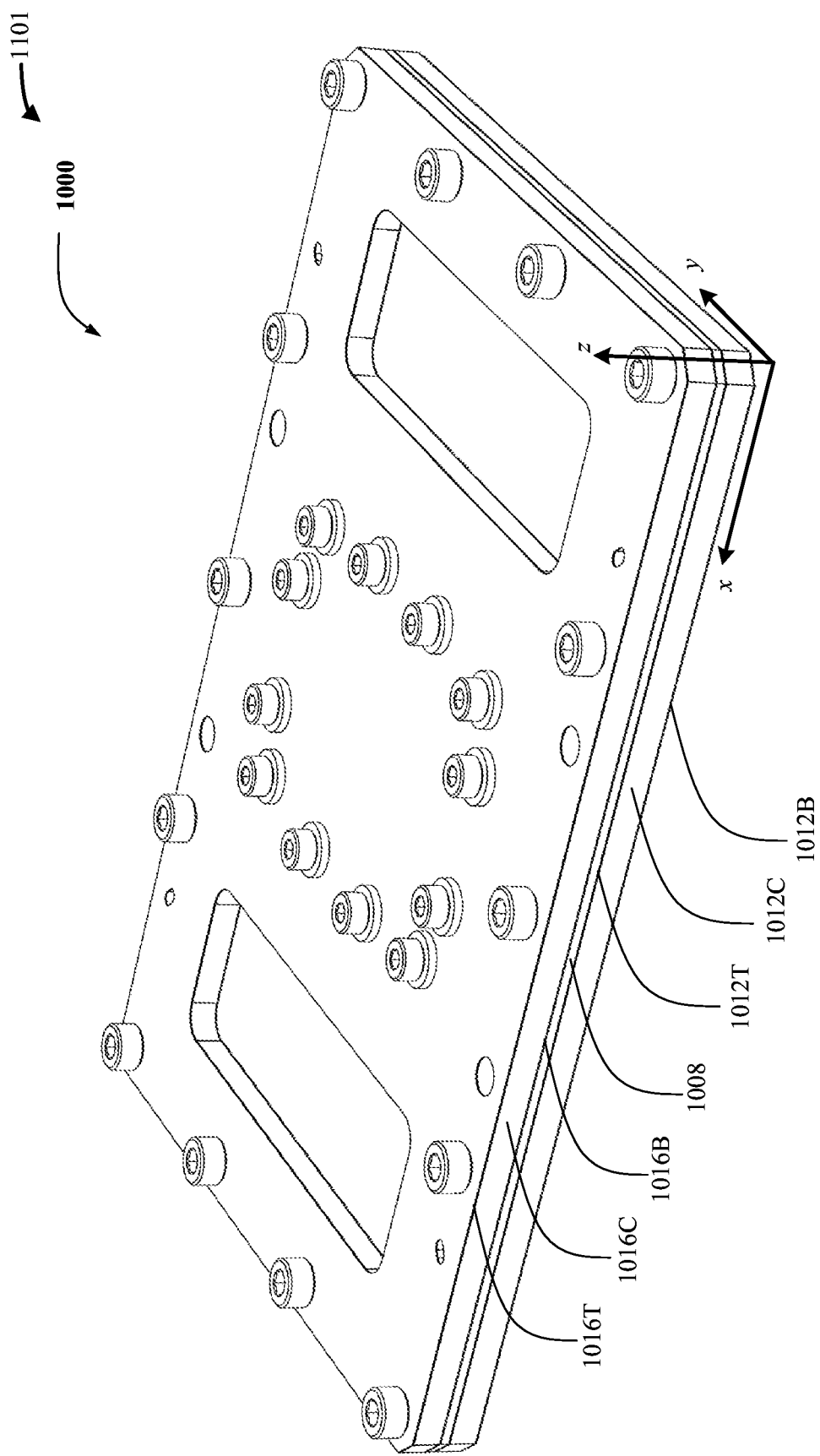
FIG. 11 illustrates another view of the electronic structure of FIG. 10, in accordance with one or more embodiments described herein.
Figure 12:
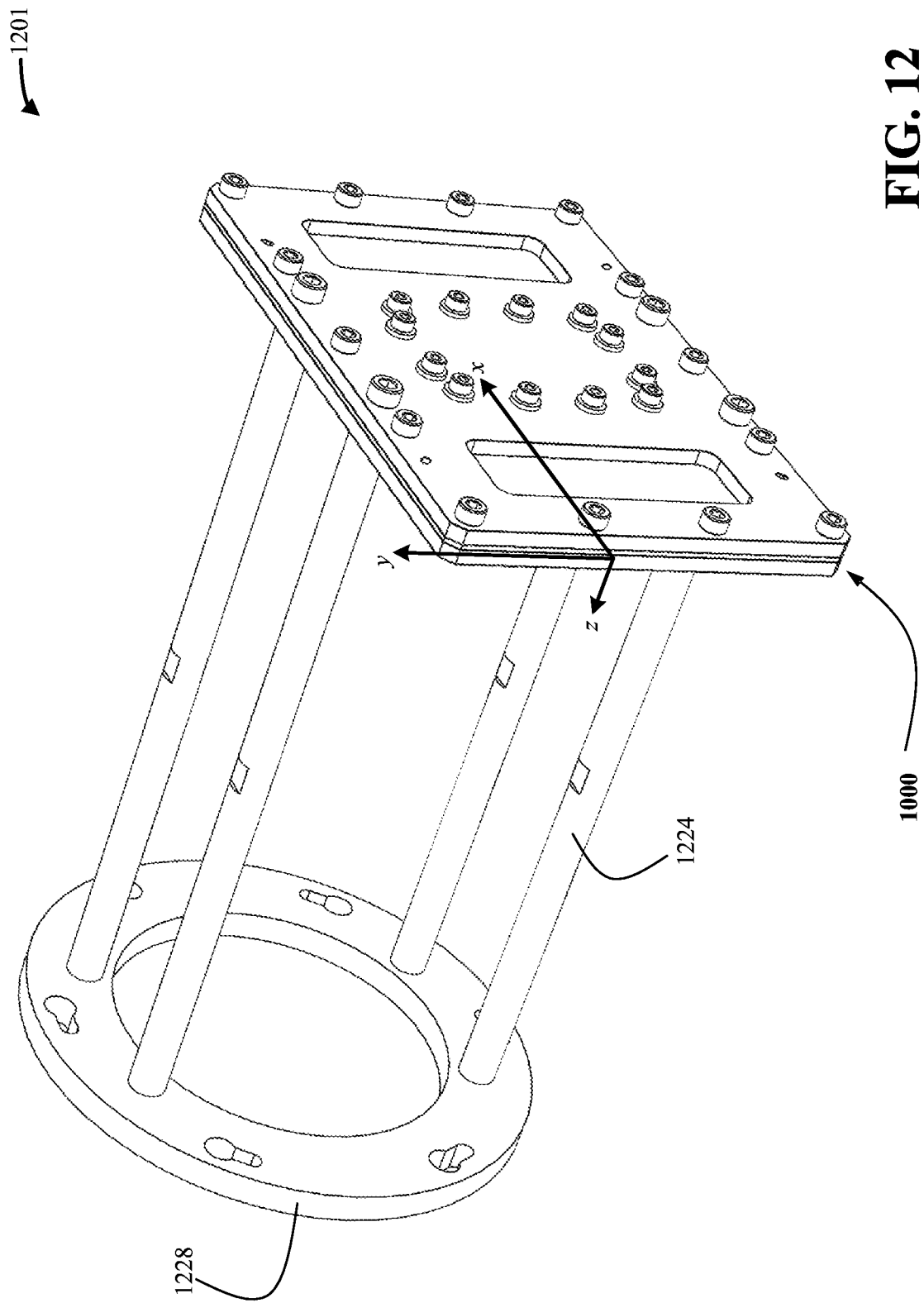
FIG. 12 illustrates still another view of the electronic structure of FIG. 10, in accordance with one or more embodiments described herein.

Turning next to FIGS. 10 to 12 (and to views 1001, 1101 and 1201), an electronic structure 1000 can comprise a circuit board 1008, electronic chip 1021 such as a silicon chip, circuit chip, electronic chip, qubit chip and/or interposer chip, a first plate 1012 and a second plate 1016. The electronic chip 1021 can be coupled (e.g., electrically and/or mechanically) at the PCB 1008. Repetitive description of like elements and/or processes employed in electronic structure embodiments 200, 500, 800 and 1000 is omitted for sake of brevity.

It is noted that binding fasteners 812S and 816S of the electronic structure 800 can increase the fabrication cost and complexity of the first plate 812 and the second plate 816.

Differently, in place of the binding fasteners at the first plate and the separate binding fasteners at the second plate, at electronic structure 1000, first plate 1012 can comprise a thin first layer 1012B composed of copper, an intermediary layer 1012C composed of molybdenum, and a thin top layer 1012T composed of copper. Likewise, second plate 1016 can comprise a thin first layer 1016B composed of copper, an intermediary layer 1016C composed of molybdenum, and a thin second layer 1016T composed of copper. Omission of separate binding fasteners for the first plate 1012 and the second plate 1016 can reduce part cost and complexity of fabrication.

For example, as shown at zoomed view 1013 of a side edge of the first plate 1012, first plate 1012 comprises a first layer 1012B and a second layer 1012T each having a thickness that is less than a thickness of the intermediary layer 1012C. It is noted that the relative thicknesses of the view 1013 are exaggerated to illustrate the layering of the first plate 1012 and are not indicative of actual relative thicknesses of the respective layers 1012B-1012C-1012T.

Thin copper layers 1012B and 1012T can be electroplated upon molybdenum layer 1012C, and copper layers 1016B and 1016T can be electroplated upon molybdenum layer 1016C. Electroplating on molybdenum can be challenging because molybdenum can have a high level of reactivity with other metals and/or can develop complex molecule oxides that can make it harder to achieve adhesion of electroplating, such as of Cu electroplated on Mo. Nevertheless, copper plating on molybdenum can be feasible, such as without compromising a non-ferromagnetic nature of the electronic structure 1000.

Referring to FIG. 12, thin copper layers 1012B, 1012T, 1016B and 1016T can be thick enough to provide sufficient thermal transport in the longitudinal x direction and lateral y direction of electronic structure 1000 to lessen and/or avoid a possibility of long, undesired thermalization time of the electronic structure 1000 to cryogenic temperatures. In one or more embodiments, about 1 micron to about 100 microns of copper can be electroplated on molybdenum, which can provide the aforementioned sufficient thermal transport.

In one or more embodiments, the first plate 1012 can have a first layer 1012B and/or a second layer 1012T having a thickness in a range of about 1 µm to about 200 µm, such as about 40 µm. Additionally, and/or alternatively, in one or more embodiments, the second plate 1016 can have a first layer 1016B and/or a second layer 1016T having a thickness in a range of about 1 µm to about 200 µm, such as about 40 µm. In one or more embodiments, such thicknesses can correspond with the first layer 1012B, first layer 1016B, second layer 1012T and/or second layer 1016T being comprised of copper, such as majoratively copper, such as about 51% to about 100% copper, such as about 85% copper or about 100% copper.

Additionally, and/or alternatively, in one or more embodiments, the first plate 1012 can have an intermediary layer 1012C having a thickness in a range of about 2 mm to about 6 mm, such as about 4 mm or such as about 4.8 mm. Additionally, and/or alternatively, in one or more embodiments, the second plate 1016 can have an intermediary layer 1016C having a thickness in a range of about 2 mm to about 6 mm, such as about 4 mm or such as about 4.8 mm. In one or more embodiments, such thicknesses can correspond with the intermediary layer 1012C and/or the intermediary layer 1016C being comprised of molybdenum, such as majoratively molybdenum, such as about 51% to about 100% molybdenum, such as about 85% molybdenum or about 100% molybdenum.

Additionally, and/or alternatively, a particular electroplating process, referred to here as electro-seeding, can be employed to apply one or more of the thin copper layers 1012B, 1012T, 1016B and/or 1016T to the respective Mo intermediary layers 1012C and 1016C. This process can comprise initially applying a seed layer of Cu onto Mo using the following steps: inserting a Mo part into a sputtering machine and drawing vacuum on the Mo part, and performing a sputter cleaning to reduce and/or eliminate oxides on the Mo part. Next, without breaking vacuum, to reduce and/or prevent oxide re-growth, titanium (Ti) can be sputter deposited onto the Mo, such as sputter depositing about 600 angstroms (0.06 µm) of Ti. Next, still without breaking vacuum, Cu can be sputter deposited on the Ti, such as sputter depositing about 1 µm of Cu on the Ti layer.

Thereafter, the vacuum can be broken, and the sputter deposited Mo part can be removed from the sputtering machine. Being protected by the Ti/Cu seed layer, the Mo cannot re-grow oxide. This process can be completed for both major sides of the Mo part and/or for any one or more sides of the Mo part (e.g., for any other surface of the Mo part).

Thereafter, a thicker layer of Cu can be applied to at least the major sides of the Mo part, such as being thicker than the electro-seeded layer of Cu. This additional thicker layer of Cu (e.g., about 1 micron to about 200 microns, such as about 40 microns) can be applied by electroplating or other suitable method.

An advantage of the electronic structure 1000 can be an ability to limit and/or prevent failure of electronic chip 1021 and/or respective solder bumps when structure 1000 is used at low temperatures, such as a cryogenic temperature of a dilution refrigerator of a cryogenic unit of a quantum computer. For example, first plate 1012 and second plate 1016 can be comprised of low-contraction materials, be layered and/or can be coupled (e.g., mechanically fixed) to the PCB 1008 such as to minimize cryogenic contraction of PCB 1008 by maintaining PCB 1008 under tension. This can minimize differential contraction between the PCB 1008 and additional plate layers of the electronic structure 1000.

Another advantage of the electronic structure 1000 can be reduction of local slippage between plates due to forces between the plates, such as frictional forces, which can in turn can reduce and/or prevent shrinkage of the circuit board.

Still another advantage of the electronic structure 1000 can be reduction in exacerbation of differential contraction between plates of the electronic structure through use of materials for at least the first plate or the second plate having a cryogenic contraction $C_M$ that is lower than that of the circuit board.

Yet another advantage of the electronic structure 1000 can be efficient thermal transport from a mounting assembly (e.g., standoffs 1224 and ring 1228) to the electronic structure 1000, such as due to the electroplating, and/or electro-seeding, and layering of the first plate 1012 and second plate 1016.

Using existing frameworks, results demonstrate that peripheral bumps of a 50 mm×50 mm interposer chip, with furthest bumps being about 34 mm from chip center, can be susceptible to failure when cooled to cryogenic temperatures. Differently, usage of electronic structure 200, 500, 800 or 1000 can reduce and/or eliminate these bump failures for at least three thermal cycles between cryogenic and room temperatures.

Figure 13:
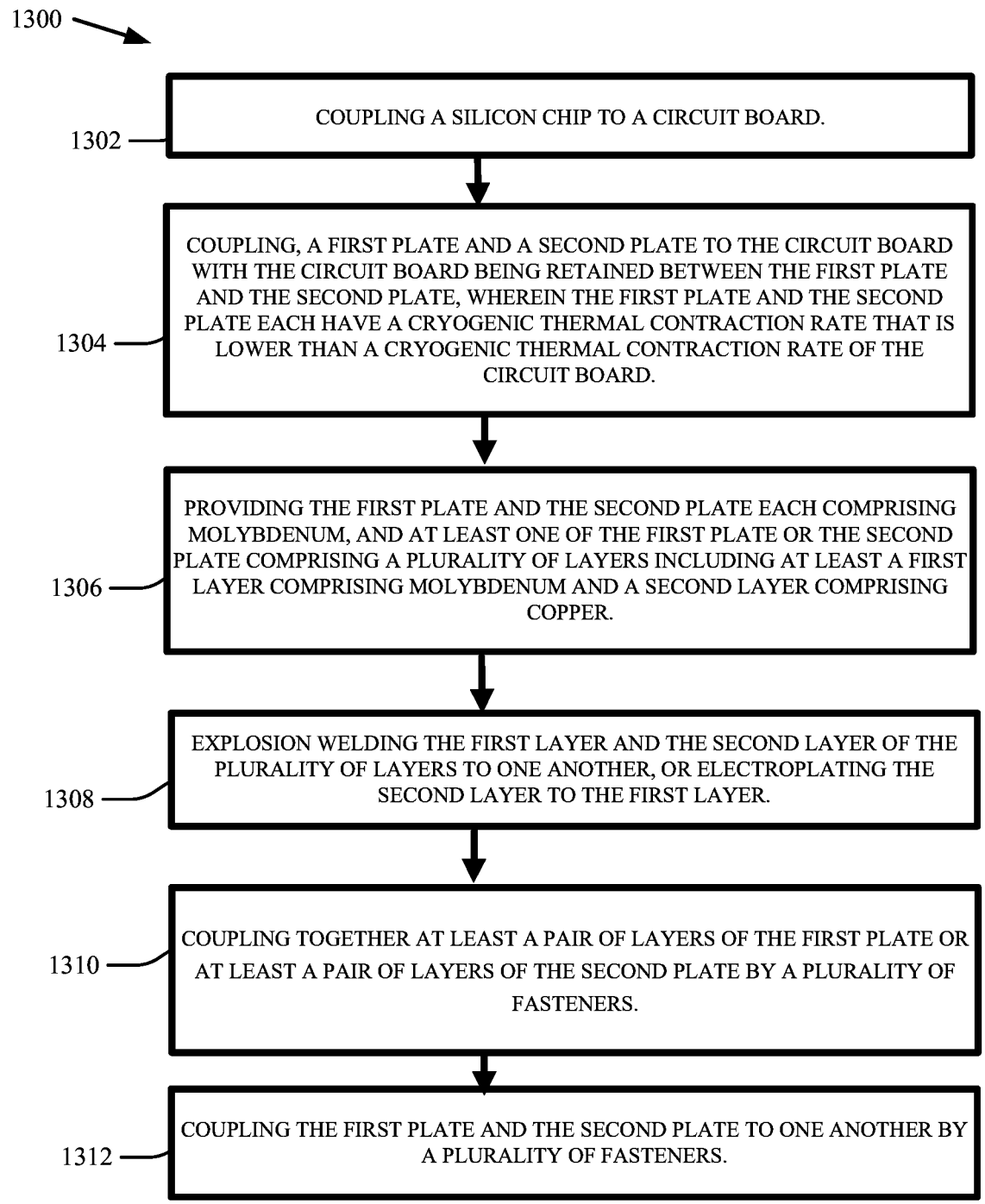
FIG. 13 illustrates a flow diagram of an example method of fabrication of an electronic device, in accordance with one or more embodiments described herein.

Referring next to FIG. 13, illustrated is a flow diagram of an example, non-limiting method 1300 that can provide a process to fabricate an electronic structure, such as the electronic structure 200, in accordance with one or more embodiments described herein. While the non-limiting method 1300 is described relative to the electronic structure 200 of FIG. 2, the non-limiting method 1300 can be applicable also to other systems described herein, such as any of the electronic structures 200, 500, 800 and/or 1000. Repetitive description of like elements and/or processes employed in respective embodiments is omitted for the sake of brevity.

At 1302, the non-limiting method 1300 can comprise coupling, by a fabrication system operatively coupled to a processor (e.g., fabrication system 256), a silicon chip to a circuit board.

At 1304, the non-limiting method 1300 can comprise coupling, by the fabrication system (e.g., fabrication system 256) a first plate and a second plate to the circuit board with the circuit board being retained between the first plate and the second plate, wherein the first plate and the second plate each have a cryogenic thermal contraction rate that is lower than a cryogenic thermal contraction rate of the circuit board.

At 1306, the non-limiting method 1300 can comprise providing, by the fabrication system (e.g., fabrication system 256), the first plate and the second plate each comprising molybdenum, and at least one of the first plate or the second plate comprising a plurality of layers including at least a first layer comprising molybdenum and a second layer comprising copper.

At 1308, the non-limiting method 1300 can comprise explosion welding, by the fabrication system (e.g., fabrication system 256), the first layer and the second layer of the plurality of layers to one another, or electroplating, by the fabrication system (e.g., fabrication system 256) the second layer to the first layer.

At 1310, the non-limiting method 1300 can comprise coupling together, by the fabrication system (e.g., fabrication system 256), at least a pair of layers of the first plate or a pair of layers of the second plate by a plurality of fasteners.

At 1312, the non-limiting method 1300 can comprise coupling, by the fabrication system (e.g., fabrication system 256), the first plate and the second plate to one another by a plurality of fasteners.

Figure 14:
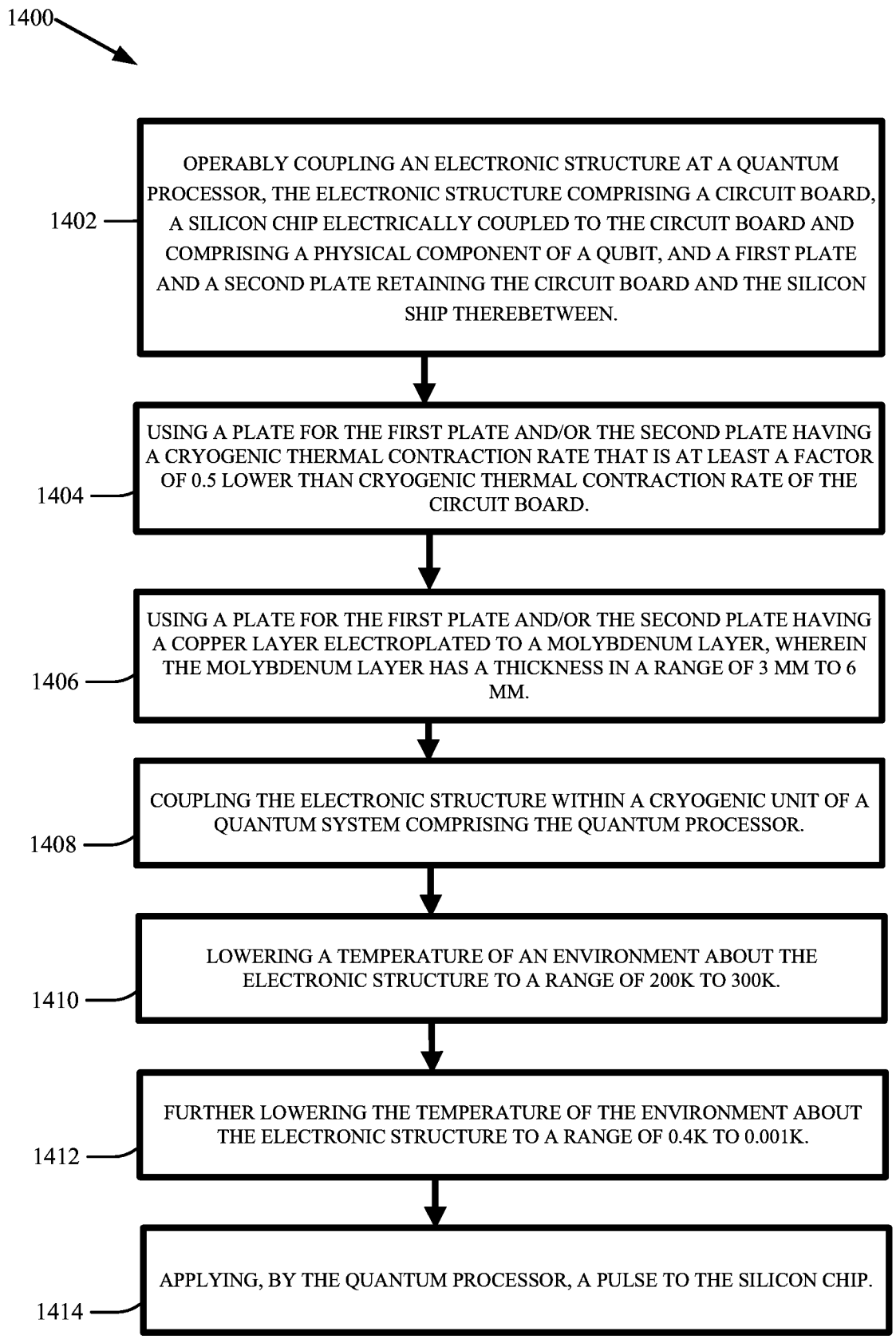
FIG. 14 illustrates a flow diagram of an example method of use of an electronic device, in accordance with one or more embodiments described herein.

Referring next to FIG. 14, illustrated is a flow diagram of an example, non-limiting method 1400 that can provide a process to fabricate an electronic structure, such as the electronic structure 200, in accordance with one or more embodiments described herein. While the non-limiting method 1400 is described relative to the electronic structure 200 of FIG. 2, the non-limiting method 1400 can be applicable also to other systems described herein, such as any of the electronic structures 200, 500, 800 and/or 1000. Repetitive description of like elements and/or processes employed in respective embodiments is omitted for sake of brevity.

At 1402, the non-limiting method 1400 can comprise coupling, by an entity, an electronic structure at a quantum processor, the electronic structure comprising a circuit board, a silicon chip electrically coupled to the circuit board and comprising a physical component of a qubit, and a first plate and a second plate retaining the circuit board and the silicon chip therebetween.

At 1404, the non-limiting method 1400 can comprise using, by the entity, a plate for the first plate and/or the second plate having a cryogenic thermal contraction rate that is at least a factor of 0.5 lower than a cryogenic thermal contraction rate of the circuit board.

At 1406, the non-limiting method 1400 can comprise using, by the entity, a plate for the first plate and/or second plate having a copper layer electroplated to a molybdenum layer, wherein the molybdenum layer has a thickness in a range of 3 mm to 6 mm.

At 1408, the non-limiting method 1400 can comprise coupling, by the entity, the electronic structure within a cryogenic unit of a quantum system comprising the quantum processor.

At 1410, the non-limiting method 1400 can comprise lowering, by the quantum system (e.g., quantum system 100), the temperature of the environment about the electronic structure to a range of 0.4K to 0.001K.

At 1412, the non-limiting method 1400 can comprise applying, by the quantum system (e.g., quantum system 100), a pulse to the silicon chip.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more devices and/or methods provided herein relate to a method for fabricating a filtering electronic device having a co-integrated impedance modification element and signal transmission line. An electronic structure can comprise a circuit board, and a first plate and a second plate retaining the circuit board therebetween, wherein the first plate and the second plate each have a cryogenic thermal contraction rate that is lower than a cryogenic thermal contraction rate of the circuit board. In one or more embodiments, a silicon chip can be physically coupled to the circuit board by a plurality of solder bumps and disposed between the first plate and the second plate.

An electronic structure comprises a circuit board, and a first plate and a second plate retaining the circuit board therebetween, wherein the first plate and the second plate each have a cryogenic thermal contraction rate that is lower than a cryogenic thermal contraction rate of the circuit board.

The electronic structure can optionally further comprise a silicon chip physically coupled to the circuit board by a plurality of solder bumps and disposed between the first plate and the second plate.

Optionally, a second silicon chip is physically coupled to the silicon chip by a plurality of solder bumps.

Relative to the electronic structure of any preceding paragraph, at least one of the first plate or the second plate comprises a plurality of layers comprising at least a first layer comprising molybdenum and a second layer comprising copper.

Optionally, the first layer and the second layer of the plurality of layers are explosion welded to one another.

Optionally, the second layer is electroplated to the first layer, and wherein the second layer comprises molybdenum and has a thickness in a range of 3 millimeters to 6 millimeters.

The electronic structure of any preceding paragraph further can comprise a first plurality of fasteners extending through at least a pair of layers of only the first plate to couple together the at least a pair of layers of the first plate, or a plurality of second fasteners extending through at least a pair of layers of only the second plate to couple together the at least a pair of layers of the second plate.

The electronic structure of any preceding paragraph further can comprise a plurality of fasteners extending through the first plate and the second plate and coupling the first plate and the second plate towards one another.

Relative to the electronic structure of any preceding paragraph, at least the first plate or the second plate has a cryogenic thermal contraction rate that is a factor of at least 0.5 lower than a cryogenic thermal contraction rate of the circuit board.

Relative to the electronic structure of any preceding paragraph, each of the first plate and the second plate comprises at least three layers comprising a first layer, a second layer and a middle layer disposed between the first layer and the second layer, and wherein the first layers comprise one of molybdenum or copper, the second layers comprise the same one of molybdenum or copper as the first layers, and the middle layers comprises the other of molybdenum or copper. Optionally, a thickness of the middle layers of the first plate and the second plate, in a direction extending normally between the respective first layers and second layers, is at least a third less thick than each of the first layers and second layers, and wherein only the middle layers comprise the copper.

A method, for fabricating an electronic structure by a fabrication system, comprises coupling, by the fabrication system, a silicon chip to a circuit board, and coupling, by the fabrication system, a first plate and a second plate to the circuit board with the circuit board being retained between the first plate and the second plate, wherein the first plate and the second plate each have a cryogenic thermal contraction rate that is lower than a cryogenic thermal contraction rate of the circuit board.

Optionally, the first plate and the second plate each comprise molybdenum, and wherein at least one of the first plate or the second plate comprises a plurality of layers comprising at least a first layer comprising molybdenum and a second layer comprising copper.

Relative to the method of any preceding paragraph, the coupling of the silicon chip to the circuit board comprises using a plurality of solder bumps to physically couple the silicon chip to the circuit board.

Relative to the method of any preceding paragraph, the second layer is electroplated to the first layer, and wherein the second layer comprises molybdenum and has a thickness in a range of 3 millimeters to 6 millimeters.

The method of any preceding paragraph further can comprise coupling together, by the fabrication system, at least a pair of layers of the first plate by a first plurality of fasteners, or coupling together, by the fabrication system, at least a pair of layers of the second plate by a second plurality of fasteners.

A method, for using a quantum system, comprises operably coupling an electronic structure at a quantum processor of the quantum system, where, the electronic structure comprises a circuit board, a silicon chip electrically coupled to the circuit board and comprising a physical component of a qubit, and a first plate and a second plate retaining the circuit board and the silicon chip therebetween, wherein the first plate and the second plate each have a cryogenic thermal contraction rate that is at least a factor of 0.5 lower than a cryogenic thermal contraction rate of the circuit board, and the method further comprises applying, by the quantum system, a pulse to the silicon chip.

Optionally, the first plate comprises a first plurality of layers, wherein a first subset of the first plurality of layers comprises copper, wherein a second subset of the first plurality of layers comprises molybdenum absent copper, wherein the second plate comprises a second plurality of layers, wherein a first subset of the second plurality of layers comprises copper, and wherein a second subset of the second plurality of layers comprises molybdenum absent copper.

Relative to the method of any preceding paragraph, the first plate can comprise at least a second layer electroplated to a first layer, wherein the second layer of the first plate comprises molybdenum and has a thickness in a range of 3 millimeters to 6 millimeters, wherein the second plate can comprise at least a second layer electroplated to a first layer, and wherein the second layer of the second plate comprises molybdenum and has a thickness in a range of 3 millimeters to 6 millimeters.

Relative to the method of any preceding paragraph, the method further can comprise lowering, by the quantum system, the temperature of an environment about the electronic structure to a range of 0.4K to 0.001K.

An electronic structure comprises a circuit board, a silicon chip physically coupled to the circuit board by a plurality of solder bumps, and a first plate and a second plate retaining the circuit board and the silicon chip therebetween, wherein the first plate and the second plate each have a cryogenic thermal contraction rate that is lower than a cryogenic thermal contraction rate of the circuit board, and wherein a cryogenic thermal contraction rate of the silicon chip is less than the cryogenic thermal contraction rate of each of the first plate and the second plate.

Optionally, the first plate and the second plate each have a cryogenic thermal contraction rate that is at least a factor of 0.5 lower than a cryogenic thermal contraction rate of the circuit board.

Relative to the electronic structure of any preceding paragraph, the first plate and the second plate each have a cryogenic thermal contraction rate that is at least a factor of 4 higher than a cryogenic thermal contraction rate of the silicon chip.

Relative to the electronic structure of any preceding paragraph, the first plate comprises at least a second layer electroplated to a first layer, wherein the second layer of the first plate comprises molybdenum and has a thickness in a range of 3 millimeters to 6 millimeters, wherein the second plate comprises at least a second layer electroplated to a first layer, and wherein the second layer of the second plate comprises molybdenum and has a thickness in a range of 3 millimeters to 6 millimeters.

An advantage of the aforementioned system, device, method of fabrication and/or method of use can be an ability to limit and/or prevent failure of an electronic chip and/or respective solder bumps when an electronic structure as described herein is used at low temperatures, such as a cryogenic temperature of a dilution refrigerator of a cryogenic unit of a quantum computer. Likewise, an additional advantage can be reduction in and/or avoidance of cracking and/or other breaking of the respective silicon chip. For example, a first plate and a second plate can be comprised of low-contraction materials, be layered and/or can be coupled (e.g., mechanically fixed) to a respective PCB such as to minimize cryogenic contraction of PCB by maintaining PCB under tension. This can minimize differential contraction between the PCB and additional plate layers of the electronic structure.

Another advantage of the aforementioned system, device, method of fabrication and/or method of use can be reduction of local slippage between plates due to forces between the plates, such as frictional forces, which can in turn can reduce and/or prevent shrinkage of the circuit board.

Still another advantage of the aforementioned system, device, method of fabrication and/or method of use can be reduction in exacerbation of differential contraction between plates of the electronic structure through use of materials for at least the first plate or the second plate having a cryogenic contraction $C_M$ that is lower than that of the circuit board.

Indeed, in view of the one or more embodiments described herein, a practical application of the system, method of fabrication and/or method of use described herein can be ability to employ, structurally retain and electrically couple to a circuit chip, such as a silicon ship, with minimal, or absent, movement of the silicon chip and/or circuit board relative to one another and/or relative to one or more retaining plates of the electronic device. As a result, less or no movement can result in less or no related component movement and thus less or no noise caused by such movement. This can include respective solder bumps experiencing less shear strain and being less likely to fail than as with existing frameworks. This is a useful and practical application of computers, thus providing enhanced (e.g., improved and/or optimized) operation of the hardware and/or software components of a target system (e.g., quantum system) by allowing for use at both room temperatures and cryogenic temperatures, and at temperatures therebetween. Overall, such tools can constitute a concrete and tangible technical and/or physical improvement in the fields of electronic chip support, retainment and coupling.

Furthermore, one or more embodiments described herein can be employed in a real-world system based on the disclosed teachings. For example, one or more electronic structure embodiments described herein can function with a quantum system that can receive as input a quantum job request and can measure a real-world qubit state of one or more qubits, such as superconducting qubits, of the quantum system, by executing the translated quantum source code at some level of the quantum system. The quantum system can employ one or more electronic structure embodiments described herein to physically support physical components of the superconducting qubits.

Moreover, a device and/or method described herein can be implemented in one or more domains to enable scaled filtering. Indeed, use of an electronic structure as described herein can be scalable, such as where plural electronic structures can be used at a single system (e.g., quantum system, radio system, control system, waveform system and/or signal transmission system) at least partially in parallel with one another.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

Turning next to FIG. 15, a detailed description is provided of additional context for the one or more embodiments described herein at FIGS. 1-14.

FIG. 15 and the following discussion are intended to provide a brief, general description of a suitable computing environment 1500 in which one or more embodiments described herein at FIGS. 1-14 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks can be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium can be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1500 contains an example of an environment for the execution of at least some of the computer code involved in performing the inventive methods, such as translation of an original source code based on a configuration of a target system by the quantum circuit execution code 2000. In addition to block 2000, computing environment 1500 includes, for example, computer 1501, wide area network (WAN) 1502, end user device (EUD) 1503, remote server 1504, public cloud 1505, and private cloud 1506. In this embodiment, computer 1501 includes processor set 1510 (including processing circuitry 1520 and cache 1521), communication fabric 1511, volatile memory 1512, persistent storage 1513 (including operating system 1522 and block 2000, as identified above), peripheral device set 1514 (including user interface (UI), device set 1523, storage 1524, and Internet of Things (IoT) sensor set 1525), and network module 1515. Remote server 1504 includes remote database 1530. Public cloud 1505 includes gateway 1540, cloud orchestration module 1541, host physical machine set 1542, virtual machine set 1543, and container set 1544.

COMPUTER 1501 can take the form of a desktop computer, laptop computer, tablet computer, smart phone, smart watch or other wearable computer, mainframe computer, quantum computer or any other form of computer or mobile device now known or to be developed in the future that is capable of running a program accessing a network or querying a database, such as remote database 1530. As is well understood in the art of computer technology, and depending upon the technology, performance of a computer-implemented method can be distributed among multiple computers and/or between multiple locations. On the other hand, in this presentation of computing environment 1500, detailed discussion is focused on a single computer, specifically computer 1501, to keep the presentation as simple as possible. Computer 1501 can be located in a cloud, even though it is not shown in a cloud in FIG. 15. On the other hand, computer 1501 is not required to be in a cloud except to any extent as can be affirmatively indicated.

PROCESSOR SET 1510 includes one, or more, computer processors of any type now known or to be developed in the future. Processing circuitry 1520 can be distributed over multiple packages, for example, multiple, coordinated integrated circuit chips. Processing circuitry 1520 can implement multiple processor threads and/or multiple processor cores. Cache 1521 is memory that is located in the processor chip package(s) and is typically used for data or code that should be available for rapid access by the threads or cores running on processor set 1510. Cache memories are typically organized into multiple levels depending upon relative proximity to the processing circuitry. Alternatively, some, or all, of the cache for the processor set can be located "off chip." In some computing environments, processor set 1510 can be designed for working with qubits and performing quantum computing.

Computer readable program instructions are typically loaded onto computer 1501 to cause a series of operational steps to be performed by processor set 1510 of computer 1501 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1521 and the other storage media discussed below. The program instructions, and associated data, are accessed by processor set 1510 to control and direct performance of the inventive methods. In computing environment 1500, at least some of the instructions for performing the inventive methods can be stored in block 2000 in persistent storage 1513.

COMMUNICATION FABRIC 1511 is the signal conduction path that allows the various components of computer 1501 to communicate with each other. Typically, this fabric is made of switches and electrically conductive paths, such as the switches and electrically conductive paths that make up busses, bridges, physical input/output ports and the like. Other types of signal communication paths can be used, such as fiber optic communication paths and/or wireless communication paths.

VOLATILE MEMORY 1512 is any type of volatile memory now known or to be developed in the future. Examples include dynamic type random access memory (RAM) or static type RAM. Typically, the volatile memory is characterized by random access, but this is not required unless affirmatively indicated. In computer 1501, the volatile memory 1512 is located in a single package and is internal to computer 1501, but, alternatively or additionally, the volatile memory can be distributed over multiple packages and/or located externally with respect to computer 1501.

PERSISTENT STORAGE 1513 is any form of non-volatile storage for computers that is now known or to be developed in the future. The non-volatility of this storage means that the stored data is maintained regardless of whether power is being supplied to computer 1501 and/or directly to persistent storage 1513. Persistent storage 1513 can be a read only memory (ROM), but typically at least a portion of the persistent storage allows writing of data, deletion of data and re-writing of data. Some familiar forms of persistent storage include magnetic disks and solid-state storage devices. Operating system 1522 can take several forms, such as various known proprietary operating systems or open-source Portable Operating System Interface type operating systems that employ a kernel. The code included in block 2000 typically includes at least some of the computer code involved in performing the inventive methods.

PERIPHERAL DEVICE SET 1514 includes the set of peripheral devices of computer 1501. Data communication connections between the peripheral devices and the other components of computer 1501 can be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1523 can include components such as a display screen, speaker, microphone, wearable devices (such as goggles and smart watches), keyboard, mouse, printer, touchpad, game controllers, and haptic devices. Storage 1524 is external storage, such as an external hard drive, or insertable storage, such as an SD card. Storage 1524 can be persistent and/or volatile. In some embodiments, storage 1524 can take the form of a quantum computing storage device for storing data in the form of qubits. In embodiments where computer 1501 is required to have a large amount of storage (for example, where computer 1501 locally stores and manages a large database) then this storage can be provided by peripheral storage devices designed for storing large amounts of data, such as a storage area network (SAN) that is shared by multiple, geographically distributed computers. IoT sensor set 1525 is made up of sensors that can be used in Internet of Things applications. For example, one sensor can be a thermometer and another sensor can be a motion detector.

NETWORK MODULE 1515 is the collection of computer software, hardware, and firmware that allows computer 1501 to communicate with other computers through WAN 1502. Network module 1515 can include hardware, such as modems or Wi-Fi signal transceivers, software for packetizing and/or de-packetizing data for communication network transmission, and/or web browser software for communicating data over the internet. In some embodiments, network control functions and network forwarding functions of network module 1515 are performed on the same physical hardware device. In other embodiments (for example, embodiments that utilize software-defined networking (SDN)), the control functions and the forwarding functions of network module 1515 are performed on physically separate devices, such that the control functions manage several different network hardware devices. Computer readable program instructions for performing the inventive methods can typically be downloaded to computer 1501 from an external computer or external storage device through a network adapter card or network interface included in network module 1515.

WAN 1502 is any wide area network (for example, the internet) capable of communicating computer data over non-local distances by any technology for communicating computer data, now known or to be developed in the future. In some embodiments, the WAN can be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1503 is any computer system that is used and controlled by an end user (for example, a customer of an enterprise that operates computer 1501) and can take any of the forms discussed above in connection with computer 1501. EUD 1503 typically receives helpful and useful data from the operations of computer 1501. For example, in a hypothetical case where computer 1501 is designed to provide a recommendation to an end user, this recommendation would typically be communicated from network module 1515 of computer 1501 through WAN 1502 to EUD 1503. In this way, EUD 1503 can display, or otherwise present, the recommendation to an end user. In some embodiments, EUD 1503 can be a client device, such as thin client, heavy client, mainframe computer and/or desktop computer.

REMOTE SERVER 1504 is any computer system that serves at least some data and/or functionality to computer 1501. Remote server 1504 can be controlled and used by the same entity that operates computer 1501. Remote server 1504 represents the machine(s) that collect and store helpful and useful data for use by other computers, such as computer 1501. For example, in a hypothetical case where computer 1501 is designed and programmed to provide a recommendation based on historical data, then this historical data can be provided to computer 1501 from remote database 1530 of remote server 1504.

PUBLIC CLOUD 1505 is any computer system available for use by multiple entities that provides on-demand availability of computer system resources and/or other computer capabilities, especially data storage (cloud storage) and computing power, without direct active management by the scale. The direct and active management of the computing resources of public cloud 1505 is performed by the computer hardware and/or software of cloud orchestration module 1541. The computing resources provided by public cloud 1505 are typically implemented by virtual computing environments that run on various computers making up the computers of host physical machine set 1542, which is the universe of physical computers in and/or available to public cloud 1505. The virtual computing environments (VCEs) typically take the form of virtual machines from virtual machine set 1543 and/or containers from container set 1544. It is understood that these VCEs can be stored as images and can be transferred among and between the various physical machine hosts, either as images or after instantiation of the VCE. Cloud orchestration module 1541 manages the transfer and storage of images, deploys new instantiations of VCEs and manages active instantiations of VCE deployments. Gateway 1540 is the collection of computer software, hardware and firmware allowing public cloud 1505 to communicate through WAN 1502.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1506 is similar to public cloud 1505, except that the computing resources are only available for use by a single enterprise. While private cloud 1506 is depicted as being in communication with WAN 1502, in other embodiments a private cloud can be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1505 and private cloud 1506 are both part of a larger hybrid cloud.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. An electronic structure comprising:
   a circuit board;
   a first plate and a second plate retaining the circuit board therebetween, wherein the first plate and the second plate each have a cryogenic thermal contraction rate that is lower than a cryogenic thermal contraction rate of the circuit board;
   a silicon chip received into a recess of the circuit board; and
   fasteners extending through the first plate and the second plate to thereby maintain the silicon chip within the recess of the circuit board,
   wherein the plurality of fasteners comprise a first plurality of fasteners extending through at least a pair of layers of only the first plate to couple together the at least a pair of layers of the first plate, or a plurality of second fasteners extending through at least a pair of layers of only the second plate to couple together the at least a pair of layers of the second plate.

2. The electronic structure of claim 1, wherein the silicon chip is physically coupled to the circuit board by a plurality of solder bumps disposed between the first plate and the second plate.

3. The electronic structure of claim 2, wherein a second silicon chip is physically coupled to the silicon chip by a plurality of solder bumps and is retained between the first plate and the second plate.

4. The electronic structure of claim 1, wherein at least one of the first plate or the second plate comprises a plurality of layers comprising at least a first layer comprising molybdenum and a second layer comprising copper.

5. The electronic structure of claim 4, wherein a pair of layers of the plurality of layers are explosion welded to one another.

6. The electronic structure of claim 4, wherein the second layer is electroplated to the first layer, and wherein the second layer comprises molybdenum and has a thickness in a range of 3 millimeters to 6 millimeters.

7. The electronic structure of claim 1, wherein the plurality of fasteners extend through the first plate and the second plate and couple the first plate and the second plate towards one another and towards the silicon chip.

8. The electronic structure of claim 1, wherein at least the first plate or the second plate has a cryogenic thermal contraction rate that is a factor of at least 0.5 lower than a cryogenic thermal contraction rate of the circuit board.

9. The electronic structure of claim 1, wherein each of the first plate and the second plate comprises at least three layers comprising a first layer, a second layer, and a middle layer disposed between the first layer and the second layer, and wherein the first layers comprise one of molybdenum or copper, the second layers comprise the same one of molybdenum or copper as the first layers, and the middle layers comprises the other of molybdenum or copper.

10. The electronic structure of claim 9, wherein a thickness of the middle layers of the first plate and the second plate, in a direction extending normally between the respective first layers and second layers, is at least a third less thick than each of the first layers and second layers, and wherein only the middle layers comprise the copper.

11. A method for fabricating an electronic structure by a fabrication system, the method comprising:
   coupling, by the fabrication system, a silicon chip to a circuit board; and
   coupling, by the fabrication system, a first plate and a second plate to the circuit board with the circuit board and the silicon chip being retained between the first plate and the second plate, wherein the first plate and the second plate each have a cryogenic thermal contraction rate that is lower than a cryogenic thermal contraction rate of the circuit board, wherein a cryogenic thermal contraction rate of the silicon chip is less than the cryogenic thermal contraction rate of each of the first plate and the second plate, and wherein at least one of the first plate or the second plate comprises a second layer electroplated to a first layer, wherein the second layer comprises molybdenum and has a thickness in a range of 3 millimeters to 6 millimeters.

12. The method according to claim 11, wherein the coupling of the silicon chip to the circuit board comprises using a plurality of solder bumps to physically couple the silicon chip to the circuit board.

13. The method according to claim 11, further comprising:
coupling together, by the fabrication system, at least a pair of layers of the first plate by a first plurality of fasteners, or
coupling together, by the fabrication system, at least a pair of layers of the second plate by a second plurality of fasteners.

14. An electronic structure, comprising:
a circuit board;
a silicon chip physically coupled to the circuit board by a plurality of solder bumps; and
a first plate and a second plate retaining the circuit board and the silicon chip therebetween, wherein the first plate and the second plate each have a cryogenic thermal contraction rate that is lower than a cryogenic thermal contraction rate of the circuit board, wherein a cryogenic thermal contraction rate of the silicon chip is less than the cryogenic thermal contraction rate of each of the first plate and the second plate, and wherein at least one of the first plate or the second plate comprises a second layer electroplated to a first layer, wherein the second layer comprises molybdenum and has a thickness in a range of 3 millimeters to 6 millimeters.

15. The electronic structure of claim 14, wherein the first plate and the second plate each have a cryogenic thermal contraction rate that is at least a factor of 0.5 lower than a cryogenic thermal contraction rate of the circuit board.

16. The electronic structure of claim 14, wherein the first plate and the second plate each have a cryogenic thermal contraction rate that is at least a factor of 4 higher than a cryogenic thermal contraction rate of the silicon chip.

17. The electronic structure of claim 1, wherein the silicon chip comprises a qubit chip.

18. The method according to claim 11, further comprising:
aligning, by the fabrication system, the silicon chip within a recess of the circuit board.

19. The electronic structure of claim 14, wherein the silicon chip comprises a qubit chip.

* * * * *